(12) United States Patent
Bhatia et al.

(10) Patent No.: US 10,565,974 B1
(45) Date of Patent: Feb. 18, 2020

(54) ATTENUATION OF ACOUSTIC PRESSURES IN RACKMOUNT SERVERS TO REDUCE DRIVE PERFORMANCE DEGRADATION

(71) Applicant: Cisco Technology, Inc., San Jose, CA (US)

(72) Inventors: Rakesh Bhatia, San Jose, CA (US); Daniel Bernard Hruska, San Carlos, CA (US); Mark Hong Chen, Palo Alto, CA (US); Bradley Ray Rentfrow, Morgan Hill, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/894,345

(22) Filed: Feb. 12, 2018

(51) Int. Cl.
*G10K 11/162* (2006.01)
*H05K 7/20* (2006.01)
*H05K 7/14* (2006.01)

(52) U.S. Cl.
CPC ......... *G10K 11/162* (2013.01); *H05K 7/1489* (2013.01); *H05K 7/20736* (2013.01); *H05K 7/20172* (2013.01)

(58) Field of Classification Search
CPC ...... G10K 11/162; G10K 11/22; G10K 11/16; G10K 11/18; G10K 11/161; G10K 2210/11; G10K 2210/3224; G10K 2210/507; H05K 7/1489; H05K 7/20736; H05K 7/20172; H05K 7/20718; H05K 7/20918; F16L 55/033; F16L 55/0336; G11B 33/08; G11B 33/128; G11B 33/142; F04D 25/166; F04D 29/663; F04D 29/664

USPC .................................. 361/679.48; 181/224
See application file for complete search history.

(56) References Cited

U.S. PATENT DOCUMENTS

| | | | |
|---|---|---|---|
| 6,104,608 A * | 8/2000 | Casinelli | H05K 7/20172 181/224 |
| 6,141,213 A * | 10/2000 | Antonuccio | G06F 1/18 361/679.48 |
| 7,644,631 B1 | 1/2010 | Bard et al. | |
| 7,667,965 B2 * | 2/2010 | Nobile | H05K 7/20745 181/202 |
| 7,986,526 B1 | 7/2011 | Howard et al. | |
| 2007/0223715 A1 | 9/2007 | Barath et al. | |
| 2007/0294777 A1 * | 12/2007 | Kobayashi | G11B 33/08 726/34 |

(Continued)

*Primary Examiner* — Dion Ferguson
*Assistant Examiner* — Amir A Jalali
(74) *Attorney, Agent, or Firm* — Edell, Shapiro & Finnan, LLC

(57) ABSTRACT

An apparatus includes a housing, one or more storage drives, one or more fans, and one or more acoustic barriers. The housing includes a bottom side bounded by a front side, a back side, a first side, and a second side opposite the first side. The housing may further include a top cover removably attached to the housing. The storage drives may be disposed within the housing at a first location. The fans may be disposed within the housing at a second location spaced from the first location. The fans may generate a flow of air through the housing, while simultaneously generating sound waves that travel throughout the housing. The acoustic barriers may be disposed between the storage drives and the fans, and configured to attenuate the sounds waves prior to the sound waves reaching the storage drives in order to reduce the throughput performance degradation of the drives.

20 Claims, 20 Drawing Sheets

(56) References Cited

U.S. PATENT DOCUMENTS

| | | | |
|---|---|---|---|
| 2008/0106864 A1* | 5/2008 | Merino | G06F 1/181 |
| | | | 361/688 |
| 2011/0284316 A1* | 11/2011 | O'Coimin | H05K 7/20736 |
| | | | 181/156 |
| 2016/0128238 A1 | 5/2016 | Shedd et al. | |
| 2017/0218978 A1* | 8/2017 | Amin-Shahidi | F04D 29/522 |
| 2017/0221526 A1* | 8/2017 | Albrecht | G06F 1/182 |
| 2018/0197523 A1* | 7/2018 | Chen | G11B 33/08 |
| 2018/0330712 A1* | 11/2018 | Chen | G11B 33/08 |

* cited by examiner

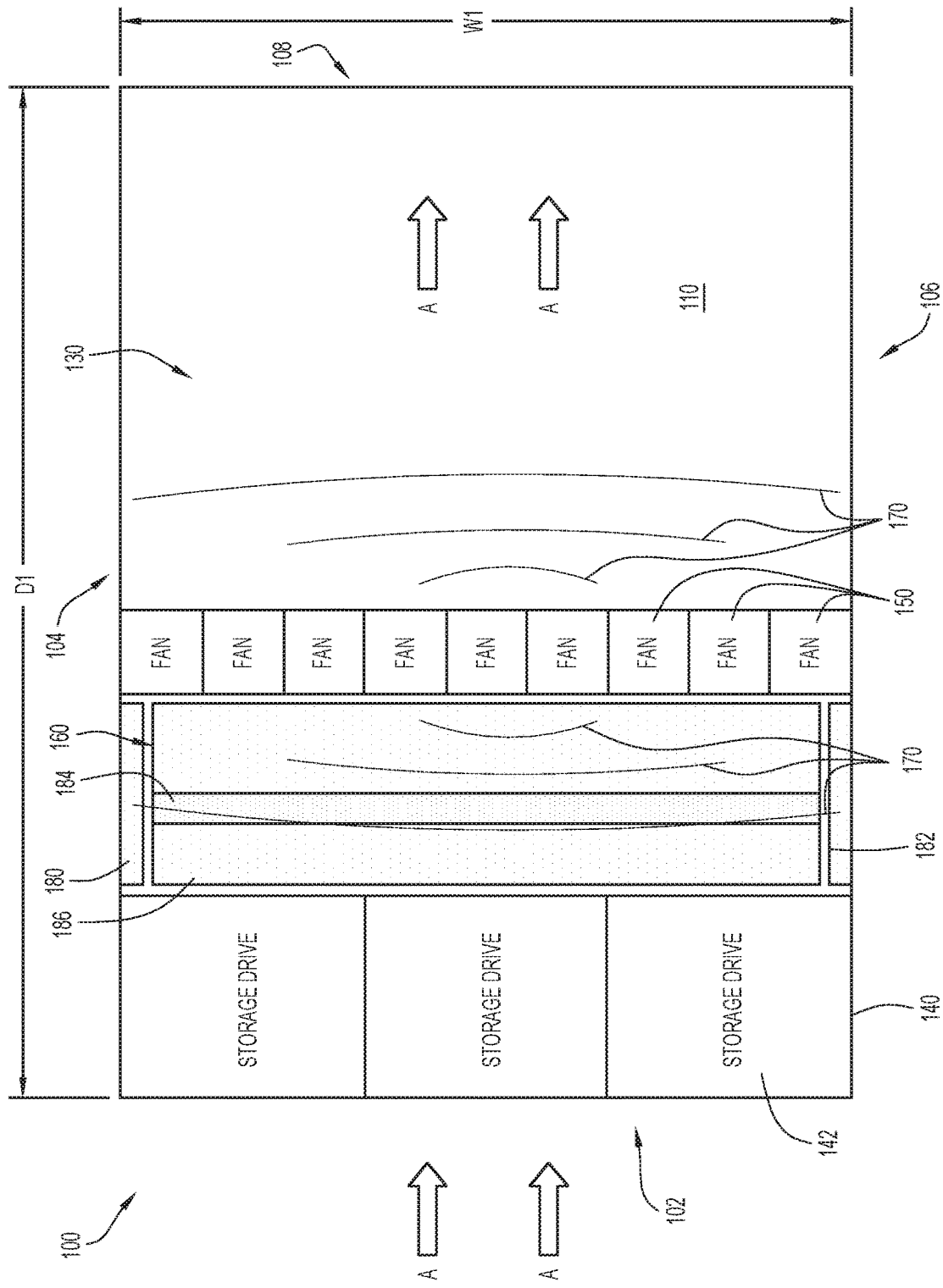

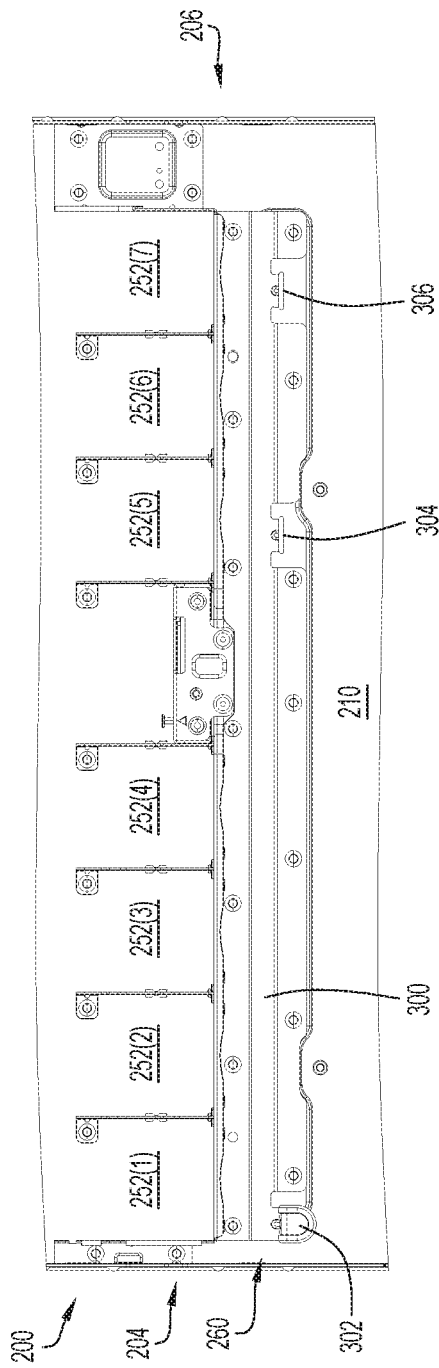
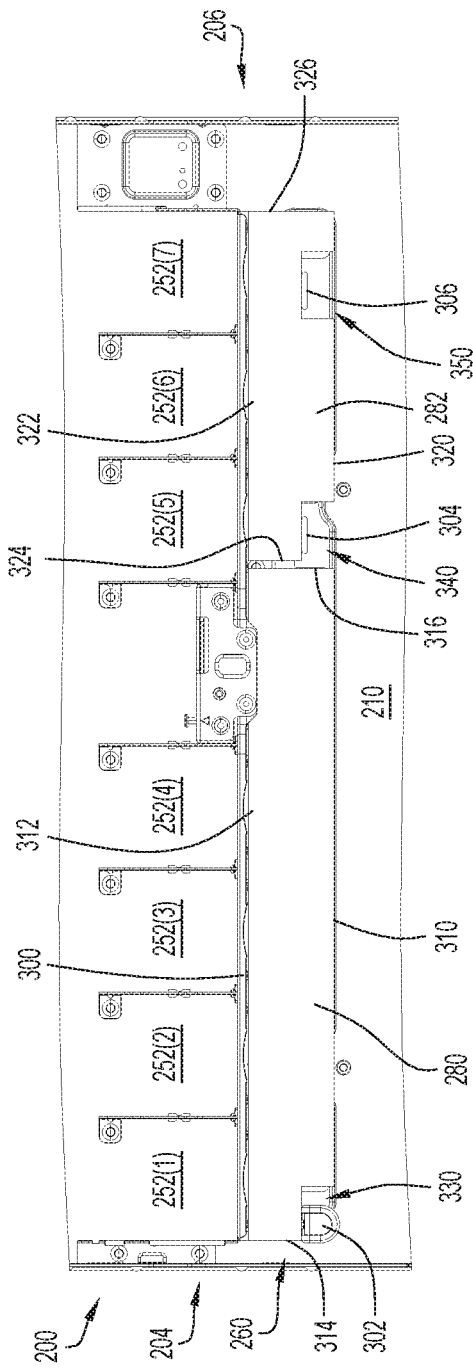

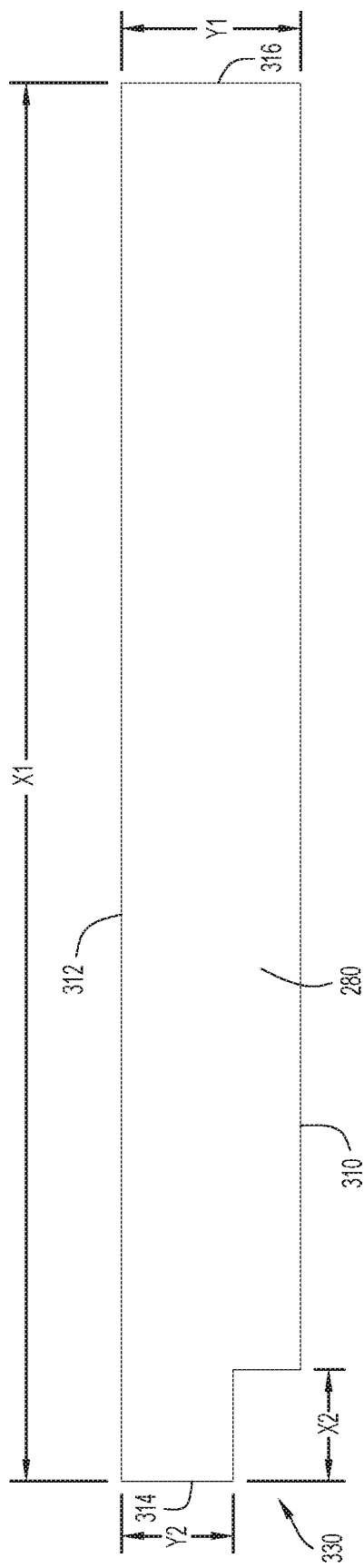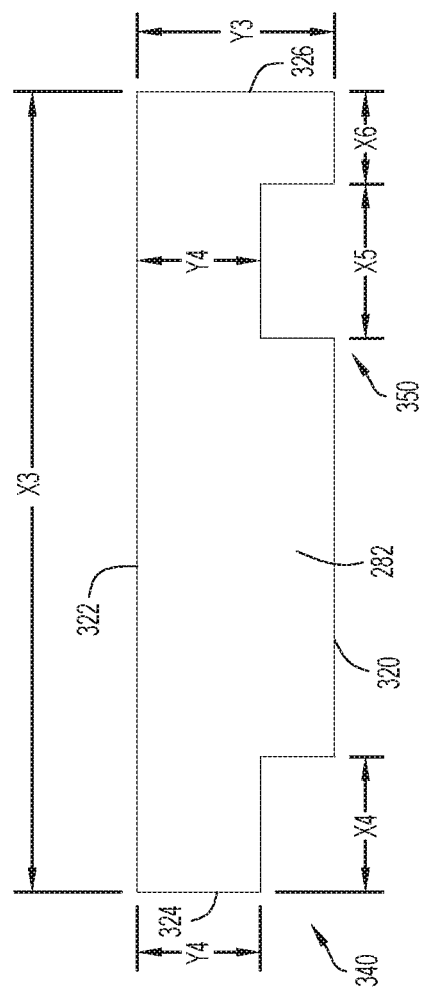

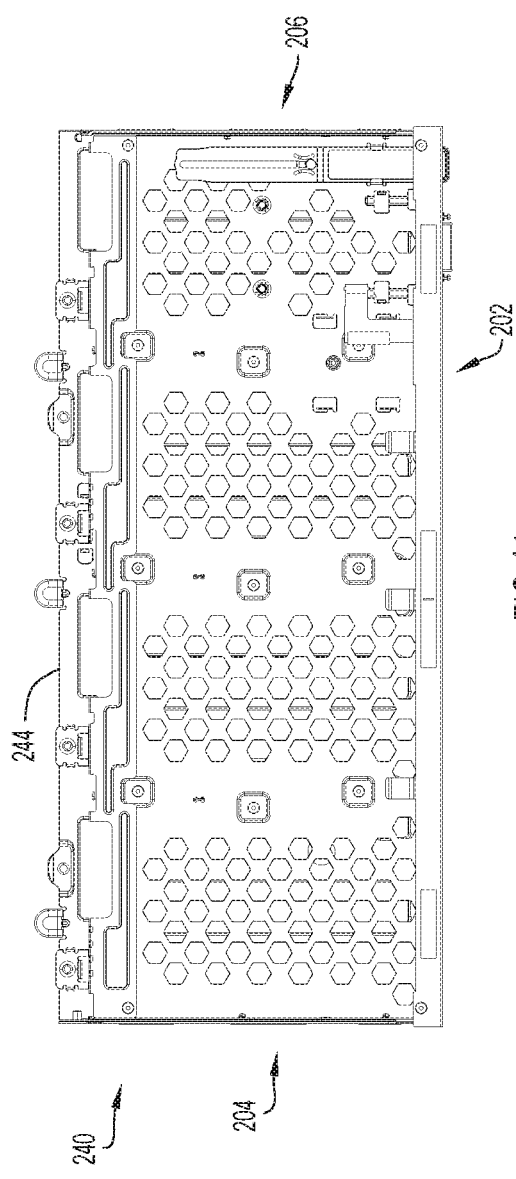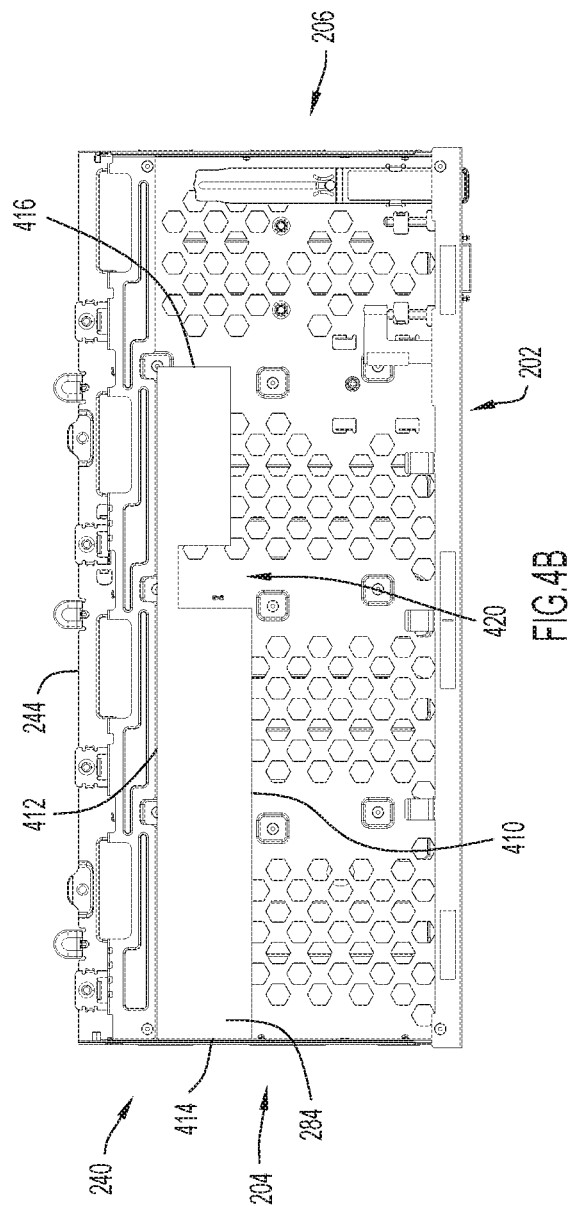

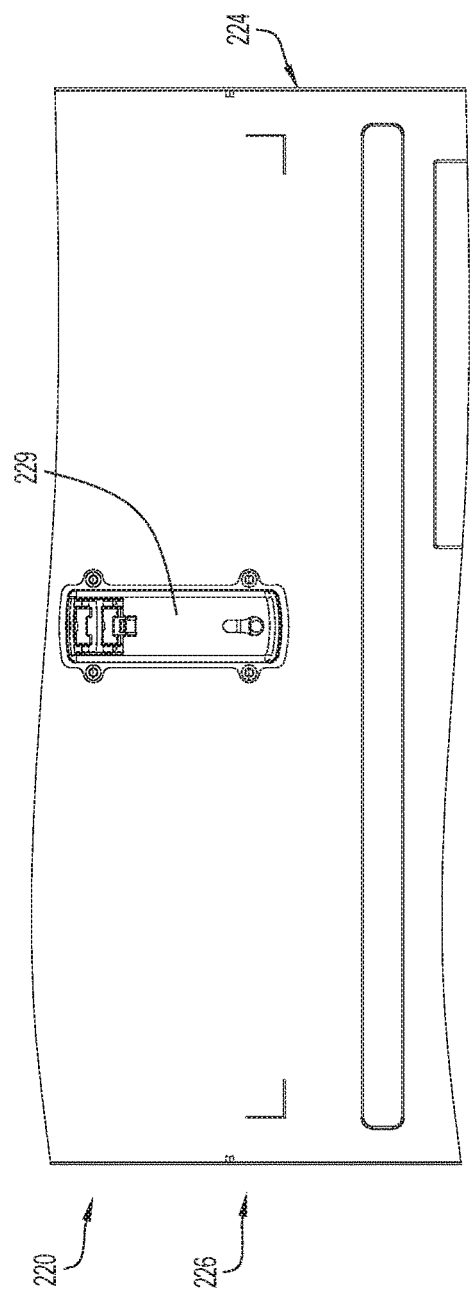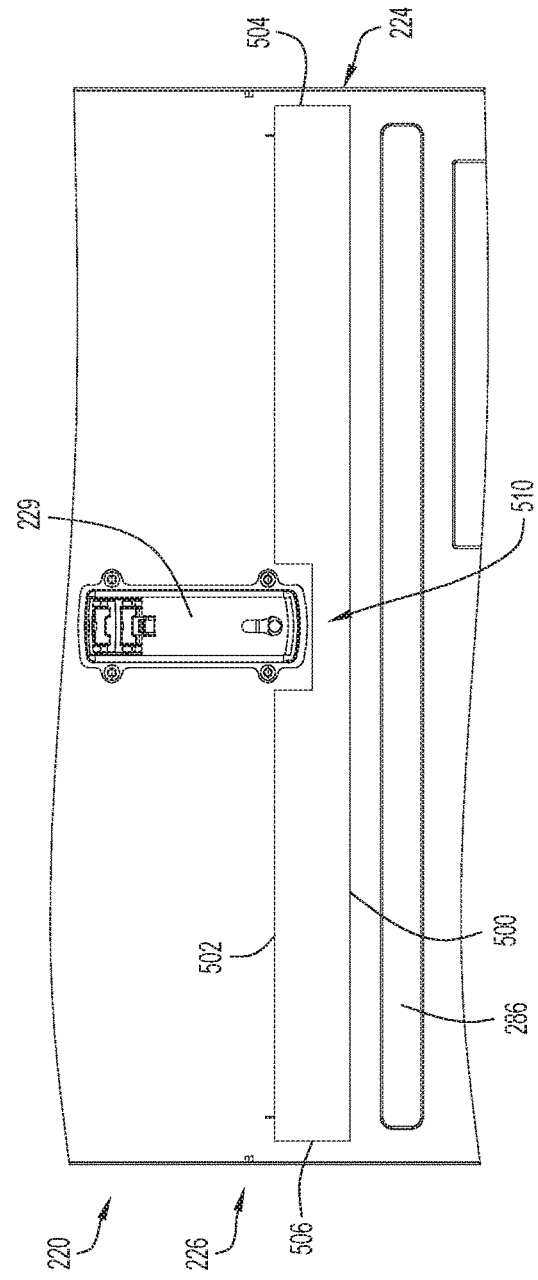

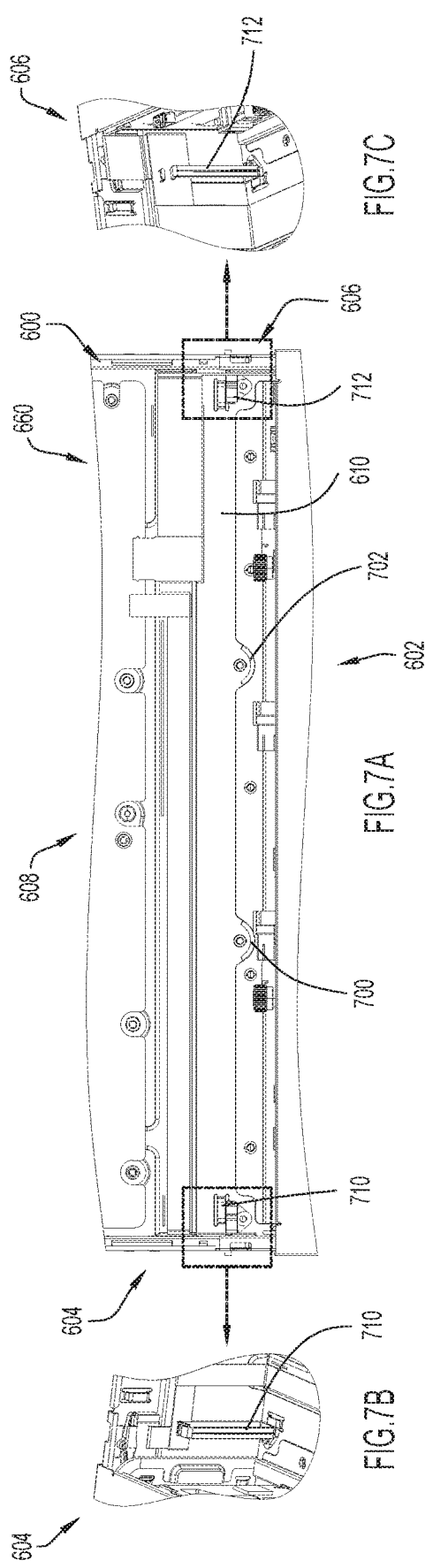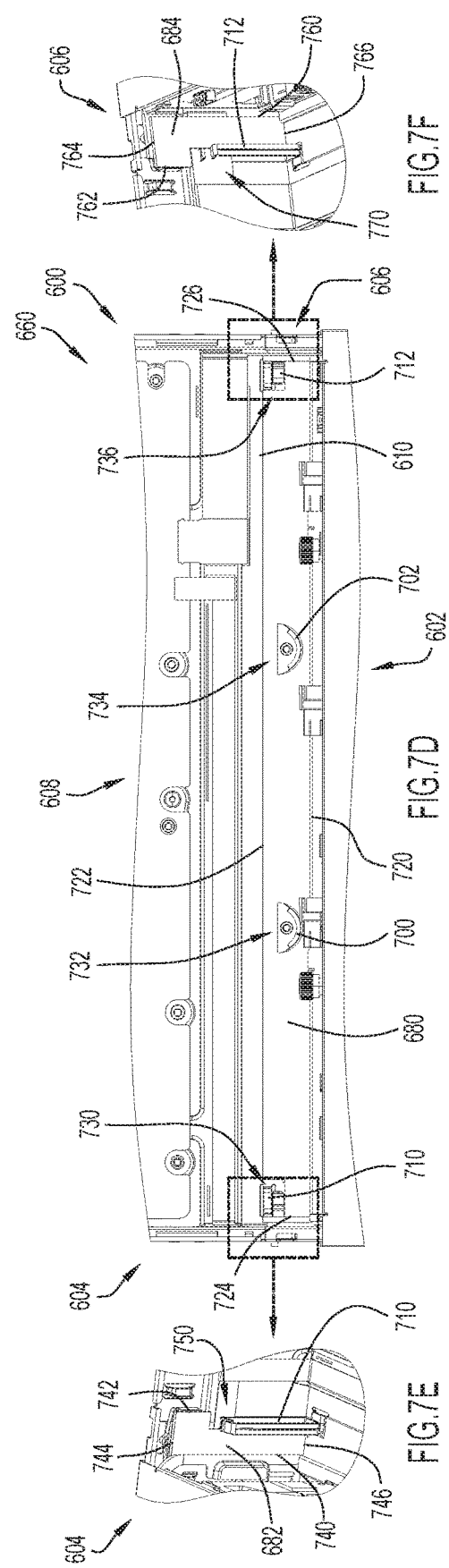

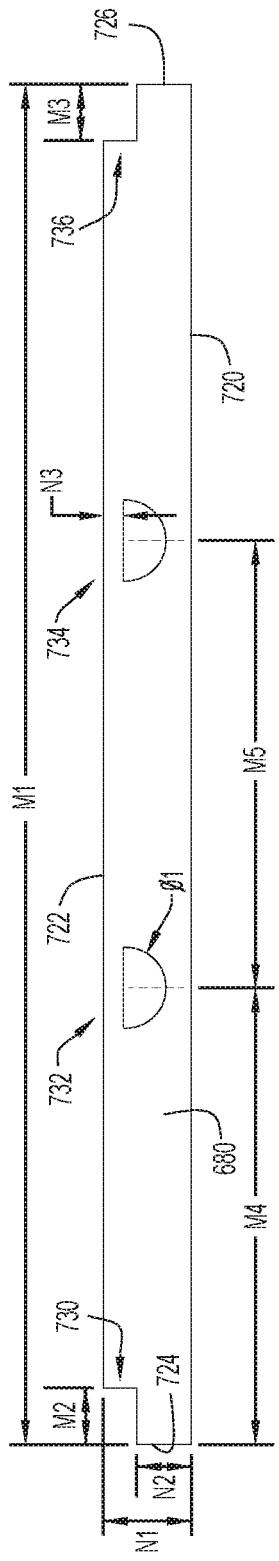

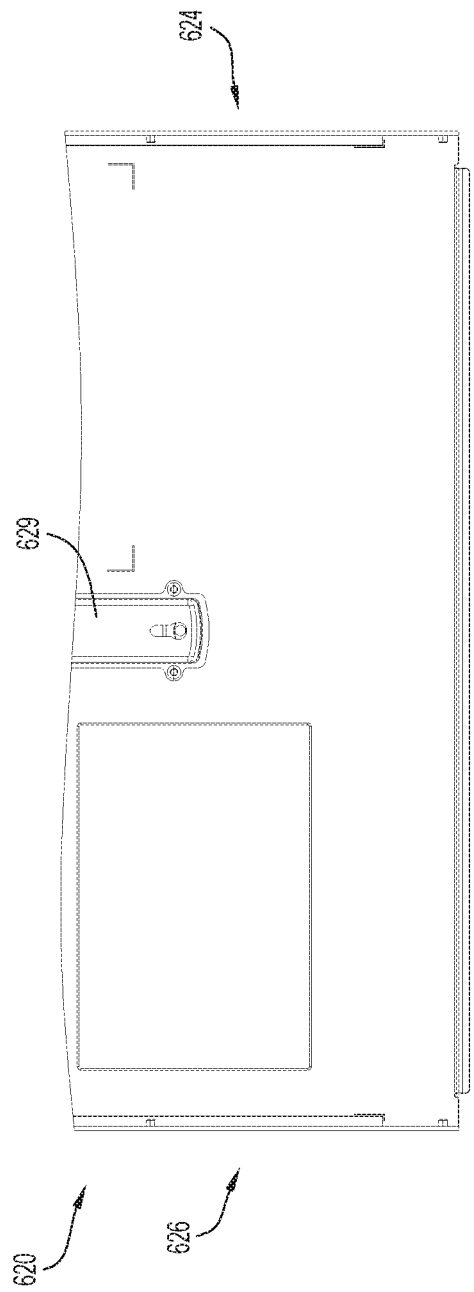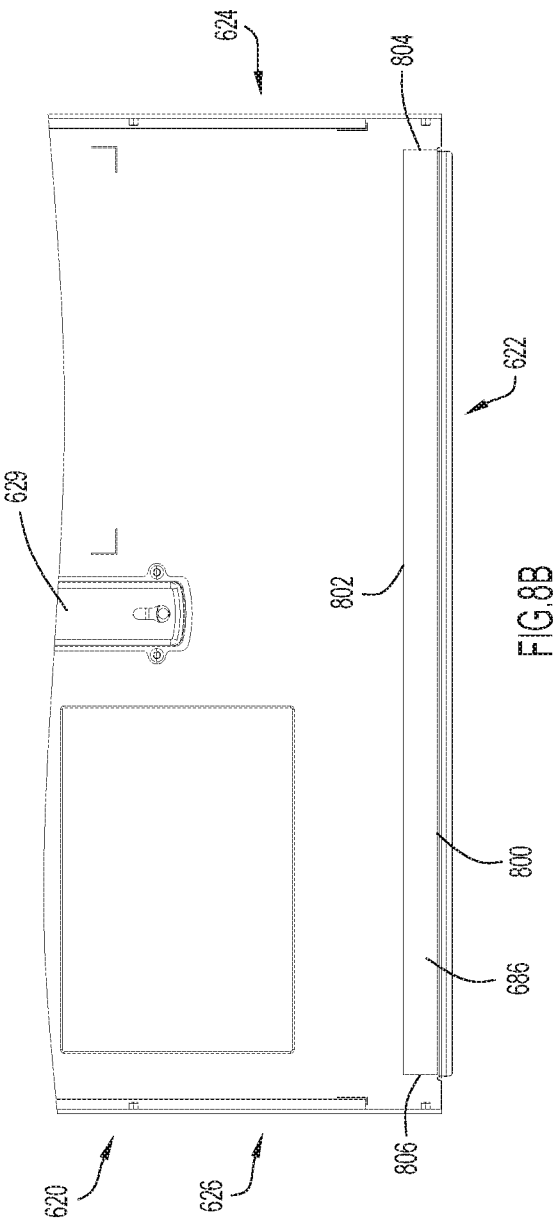

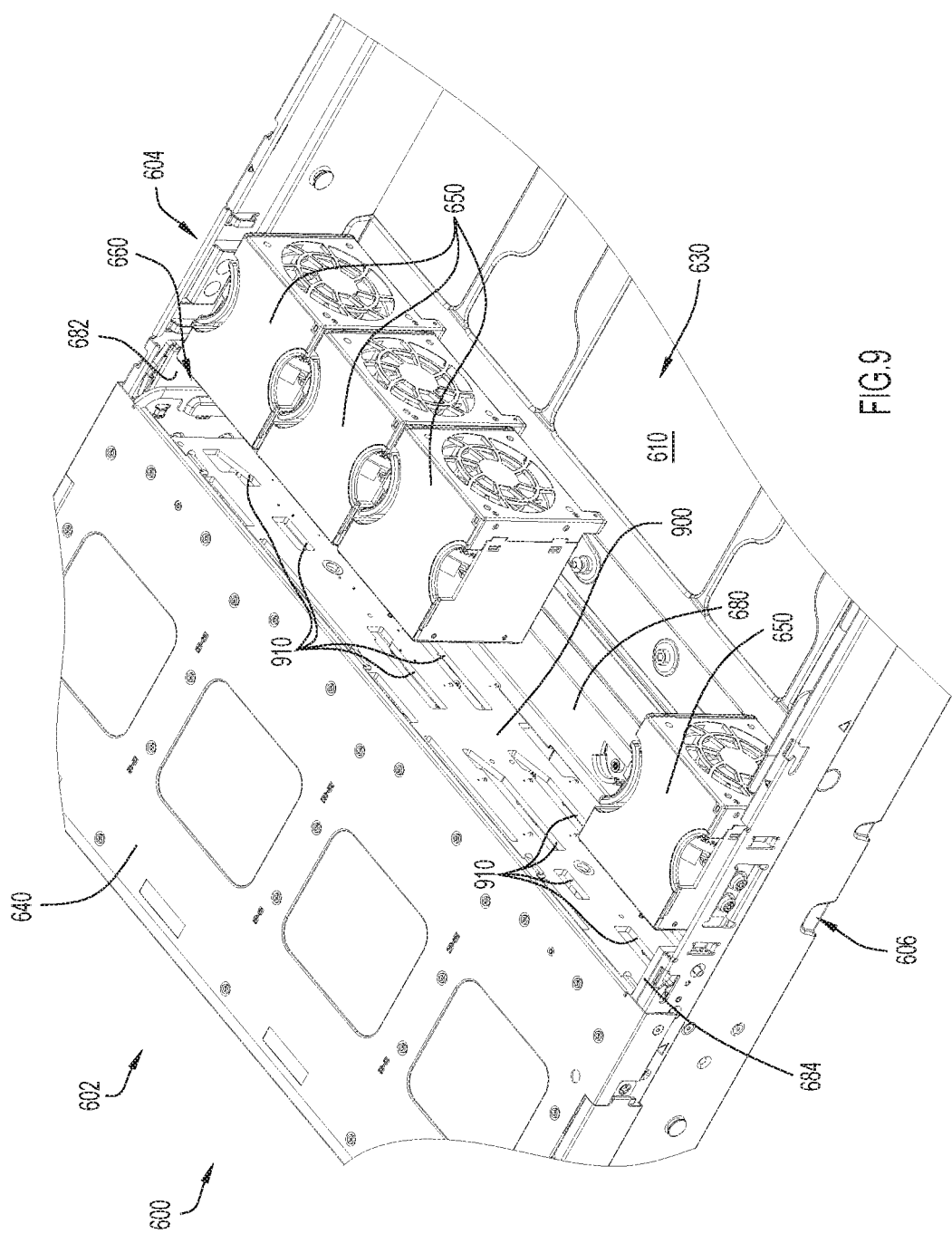

ATTENUATION OF ACOUSTIC PRESSURES IN RACKMOUNT SERVERS TO REDUCE DRIVE PERFORMANCE DEGRADATION

TECHNICAL FIELD

The present disclosure relates to rackmount servers.

BACKGROUND

Vibrations from rackmount server cooling fans are known to impact the throughput performance of the storage or hard disk drives (HDD) of the rackmount server. To combat throughput performance degradation of the storage drives of the rackmount server, the fans and the storage drives are mounted within the rackmount server utilizing mechanical foam or dampening materials to isolate the transmission of mechanical vibrations from the fans to the storage drives. However, even after fan mechanical vibrations have been isolated and dampened, the storage drive throughput performance may still be degraded due to acoustic pressures (i.e., the propagation of sound waves) emitted from the cooling fans.

BRIEF DESCRIPTION OF THE DRAWINGS

FIG. 1A illustrates a schematic top view diagram of a rackmount server equipped with acoustic barriers disposed in the spacing between the storage drives of the rackmount server and the series of fans of the rackmount server, according to an example embodiment.

FIG. 3A illustrates a top view of the fan area of the 1U rackmount server illustrated in FIG. 2A, according to an example embodiment.

FIG. 3B illustrates a top view of the fan area of the 1U rackmount server illustrated in FIG. 2B.

FIG. 3C illustrates a top view of the first acoustic barrier illustrated in FIG. 3B.

FIG. 3D illustrates a top view of the second acoustic barrier illustrated in FIG. 3B.

FIG. 4A illustrates a top view of the storage drive area of the 1U rackmount server illustrated in FIG. 2A, according to an example embodiment.

FIG. 4B illustrates a top view of the storage drive area of the 1U rackmount server illustrated in FIG. 2B.

FIG. 5A illustrates a bottom view of the top cover of the 1U rackmount server illustrated in FIG. 2C without being equipped with acoustic barriers, according to an example embodiment.

FIG. 5B illustrates a bottom view of the top cover of the 1U rackmount server illustrated in FIG. 2C while equipped with an acoustic barrier.

FIG. 7A illustrates a top view of the area between the storage drives and the series of fans of the 2U rackmount server illustrated in FIG. 6A, according to an example embodiment.

FIG. 7B illustrates a side elevational view of a portion of a first sidewall located between the storage drives and the series of fans of the 2U rackmount server illustrated in FIG. 6A.

FIG. 7C illustrates a side elevational view of a portion of a second sidewall located between the storage drives and the series of fans of the 2U rackmount server illustrated in FIG. 6A.

FIG. 7D a top view of the area between the storage drives and the series of fans of the 2U rackmount server illustrated in FIG. 6B.

FIG. 7E illustrates a side elevational view of a portion of the first sidewall located between the storage drives and the series of fans of the 2U rackmount server illustrated in FIG. 6B.

FIG. 7F illustrates a side elevational view of a portion of the second sidewall located between the storage drives and the series of fans of the 2U rackmount server illustrated in FIG. 6B.

FIG. 7G illustrates a top view of the first acoustic barrier illustrated in FIG. 7D.

FIG. 7H illustrates a side elevational view of the second acoustic barrier illustrated in FIG. 7E.

FIG. 7I illustrates a side elevational view of the second acoustic barrier illustrated in FIG. 7F.

FIG. 8A illustrates a bottom view of the top cover of the 2U rackmount server illustrated in FIG. 6C without being equipped with acoustic barriers.

FIG. 8B illustrates a bottom view of the top cover of the 2U rackmount server illustrated in FIG. 6C while being equipped with an acoustic barrier.

FIG. 9 illustrates a perspective view of an acoustic barrier disposed against the backplane of the storage drives of the 2U rackmount server illustrated in FIG. 6A.

Like reference numerals have been used to identify like elements throughout this disclosure.

DESCRIPTION OF EXAMPLE EMBODIMENTS

Overview

Figure 1B:
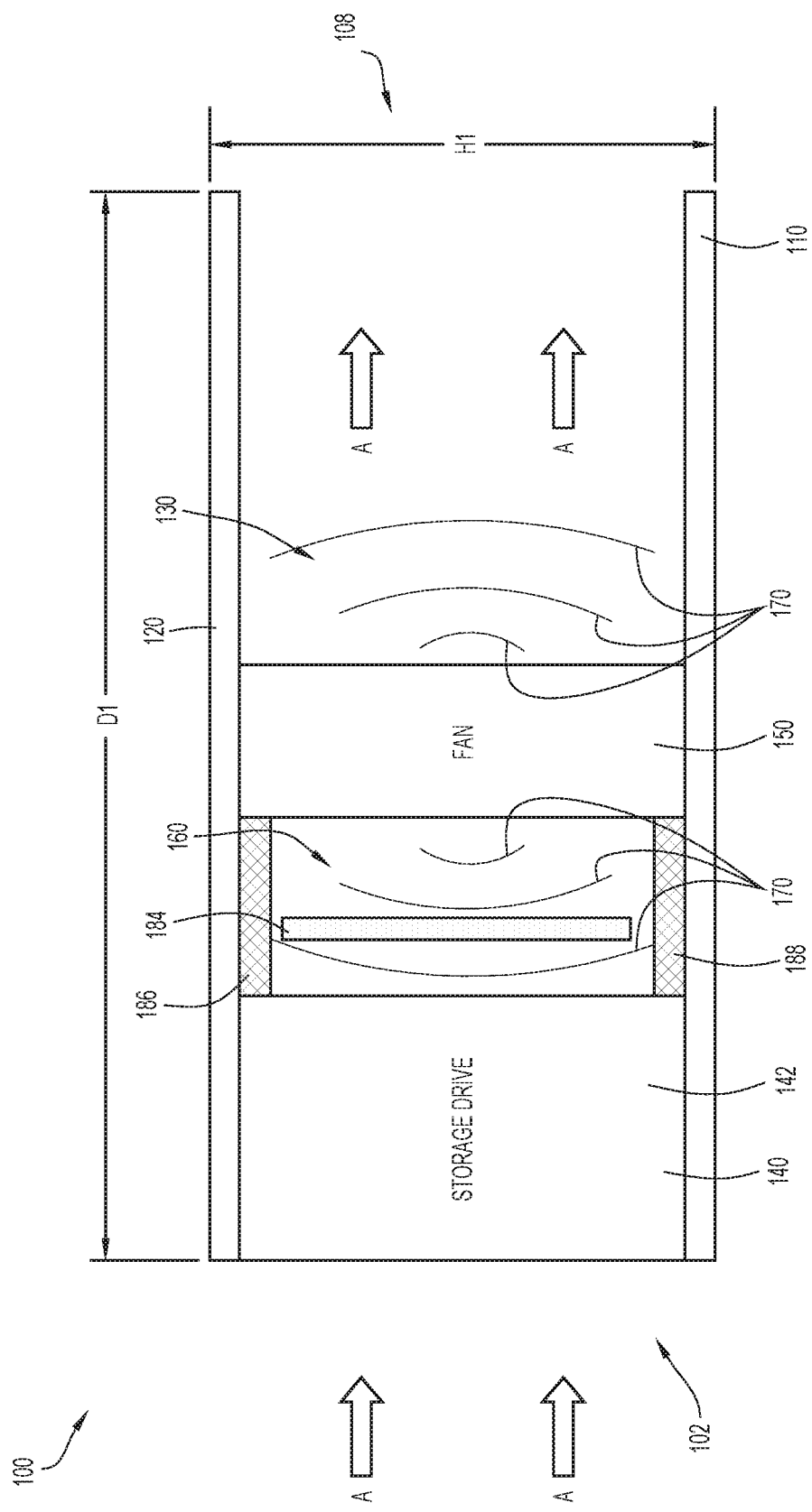
FIG. 1B illustrates a schematic cross-sectional diagram of the rackmount server of FIG. 1A which is equipped with acoustic barriers disposed between the storage drives of the rackmount server and the series of fans of the rackmount server.

An apparatus includes a housing, one or more storage drives, one or more fans, and one or more acoustic barriers. The housing includes a bottom side bounded by a front side, a back side, a first side, and a second side opposite the first side. The housing may further include a top cover removably attached to the housing. The storage drives may be disposed within the housing at a first location. The fans may be disposed within the housing at a second location spaced from the first location. The fans may generate a flow of air through the housing, while simultaneously generating sound waves that travel throughout the housing. The acoustic barriers may be disposed between the storage drives and the fans, and configured to attenuate the sounds waves prior to the sound waves reaching the storage drives in order to reduce the throughput performance degradation of the drives.

Example Embodiments

Presented herein is the strategic placement of acoustic barriers within the housing of a server in order to attenuate the acoustic pressures experienced by the storage drives. As cooling fans disposed within servers continue to increase in operating speeds, the sounds they generate also increases. The acoustic pressures generated by the increased operating speeds of the cooling fans has become a contributor to the loss of storage drive performance in servers. The acoustic pressures emitted by the cooling fans propagate throughout the housing of the server, causing vibration of the storage drives, which results in the performance degradation of the storage drives. The strategic placement of acoustic barriers or acoustic members between the cooling fans and the storage drives enables the acoustic barriers to attenuate the acoustic pressures emitted by the cooling fans, which reduces the negative effect of the acoustic pressures on the performance of the storage drives. The strategic placement of the acoustic barriers also minimizes any impediment of the flow of cooling air through the housing by the acoustic barriers. In addition to placement, the acoustic barriers may be shaped to maximize acoustic pressure attenuation while minimizing impediment of the flow of cooling air through the housing.

In order to describe the rackmount servers presented herein, terms such as "left," "right," "top," "bottom," "front," "rear," "side," "height," "length," "width," "upper," "lower," "interior," "exterior," "inner," "outer," "depth," and the like as may be used. However, it is to be understood that these terms merely describe points of reference and do not limit the present invention to any particular orientation or configuration. For example, the terms "height," "width," and "depth" may be used to describe certain embodiments presented herein, but it is to be understood that these terms are not intended to limit the orientation of the rackmount server presented herein. Instead, the rackmount server presented herein may be oriented vertically, horizontally, or in any other manner when installed into a server rack. Thus, even if a certain dimension is described herein as a "height," it may be understood that this dimension may provide a width or depth, and vice versa, when the rackmount server is reoriented.

Reference is first made to FIGS. 1A and 1B, which illustrate a schematic drawing of a rackmount server 100. Generally, the rackmount server 100 includes a front side 102, a first (i.e., left) side 104, a second (i.e., right) side 106, a rear side 108, and a bottom side 110. The front side 102 and the rear side 108 extend parallel to one another from the first side 104 to the second side 106, and substantially define the external width W1 of the rackmount server 100 (insofar as substantially is meant to imply, for example, that the width W1 may be determined based on the length of the front side 102 or the length of the front side 102 plus the thicknesses of first side 104 and second side 106). Meanwhile, first and second sides 104, 106 extend parallel to one another and substantially vertically from the bottom side 110 such that the first and second sides 104, 106 may substantially define the external height H1 and external depth D1 of the schematic rackmount server 100. The rackmount server 100 may also include a removable top cover 120 (best illustrated in FIG. 1B) that may be pivotally, slidably, or otherwise movably and/or removably attached to the schematic rackmount server 100.

In the schematic illustration, the rackmount server 100 may be any size that is configured to fit within a slot of a chassis/enclosure/server rack. For example, the rackmount server 100 may be of any size, including, but not limited to, a 1U rackmount server, a 2U rackmount server, etc., where a 1U rackmount server is sized to fit within a 1U slot of an enclosure/chassis/server rack, and a 2U rackmount server is sized to fit within a 2U slot of an enclosure/chassis/server rack. Moreover, the rackmount server 100 may represent a full width rackmount server, a half width rackmount server, and any other width rackmount server. Still further, in some embodiments, 1U rackmount server 100 may be configured to receive storage drives of different sizes.

As further illustrated in FIGS. 1A and 1B, the front side 102, the first side 104, the second side 106, the rear side 108, the bottom side 110, and the removable top cover 120 collectively define a storage area 130. The removable storage cover 120 may provide top-down access to the storage area 130. That is, any components included in the storage area 130 may be accessed from a position above the rackmount server 100 (however, as mentioned above, orientation terms are merely meant to be examples, so in some instances, cover 120 may provide horizontal access if the storage blade is oriented vertically). Meanwhile, the rear side 108 may include a backplane or any similar components to connect the storage area 130 and/or the components stored in the storage area 130 to other servers installed in the chassis/enclosure/rack in which the rackmount server 100 is installed.

With continued reference to FIGS. 1A and 1B, the rackmount server 100 is configured to receive and support, among other components (i.e., motherboard, processor, random-access memory (RAM), etc.), storage drive carriers 140 (with one or more storage drives 142 (i.e., hard disk drives (HDDs) mounted therein)). As illustrated in FIG. 1A, the storage drive carriers 140 are disposed proximate to the front side 102 of the rackmount server 100, while extending from the first side 104 to the second side 106. This results in the storage drives 142 being disposed proximate to the front side 102 of the rackmount server 100 and spanning substantially from the first side 104 to the second side 106. As further illustrated in FIG. 1B, the storage drive carrier 140 and the storage drives 142 are disposed within the storage area 130 such that the storage drives 142 span from the bottom side 110 to the top cover 120. The one or more storage drives 142 may be disposed within the storage drive carriers 140 such that air may be capable of flowing around the storage drives 142 via airflow path A.

The rackmount server 100 illustrated in FIGS. 1A and 1B further includes a series of cooling fans 150 disposed within the storage area 130. The series of fans 150 may be disposed within the storage area 130 at a location between the front side 102 and the rear side 104 such that the cooling fans 150 are spaced from the storage drive carriers 140. The series of cooling fans 150 may be aligned next to one another such that the series of cooling fans 150 span across the bottom 110 of the rackmount server 100 from the first side 104 to the second side 106, while also spanning from the bottom side 110 to the top cover 120. As illustrated in FIGS. 1A and 1B, the cooling fans 150 are separated from the storage drive carriers 140 and the storage drives 142 by region or spacing 160. The series of fans 150 are powered to pull air into the storage area 130 through the front side 102, push/pull the air through the storage area 130, and expel the air from the rear side 108 of the rackmount server 100 such that the air travels long pathway A. The movement of the air through the rackmount server 100 serves to cool the storage drives 142, along with any other components that may be located within the storage area 130. However, when the series of fans 150 are powered to pull air through the storage area 130, each one of the series of fans 150 emits acoustic pressures (i.e., sound waves) 170 that may travel in all directions from the series of fans 150, including against the pathway A of the air. Thus, as illustrated in FIGS. 1A and 1B, it is possible for the sound waves to travel against the pathway A of the air from the series of fans 150 to the storage drives 142, which, as previously explained, can degrade the throughput performance of the storage drives 142.

However, as depicted in FIGS. 1A and 1B, the region 160 disposed between the storage drives 142 and the series of fans 150 may contain a series of acoustic barriers 180, 182, 184, 186, and 188. More specifically, a first upstanding acoustic barrier 180 is disposed along the inner surface of the first side 104, while a second upstanding acoustic barrier 182 may be disposed along the inner surface of the second side 106. Both the first and second upstanding acoustic barriers 180, 182 substantially span the length of the region 160 from the series of fans 150 to the storage drives 142. In addition, one or more central upstanding acoustic barriers 184 may also be disposed within the region 160 between the storage drives 142 and the series of fans 150 such that the central upstanding acoustic barriers 184 may span substantially from the first side 104 to the second side 106 of the rackmount server 100. These upstanding acoustic barriers 180, 182, 184 may also span substantially from the bottom side 110 to the top cover 120. The upstanding central acoustic barrier 184 may be shaped in order to enable the movement of air along pathway A through the storage area 130 despite the presence of the upstanding central acoustic barriers 184 within the region 160. As best illustrated in FIG. 1B, the region 160 may be further equipped with an upper acoustic barrier 188 disposed along the inner surface of the top cover 120 and a lower acoustic barrier 186 disposed along the inner surface of the bottom side 110. The upper and lower acoustic barriers 186, 188 may span substantially from the first side 104 to the second side 106, while also spanning substantially from the storage drives 142 to the fans 150. The placement of the acoustic barriers 180, 182, 184, 186, 188 within the region 160 enables the attenuation of the amplitude of the sound waves 170 traveling from the series of fans 150 to the storage drives 142, which may result in the reduction of storage drive 142 throughput performance degradation.

Figure 2A:
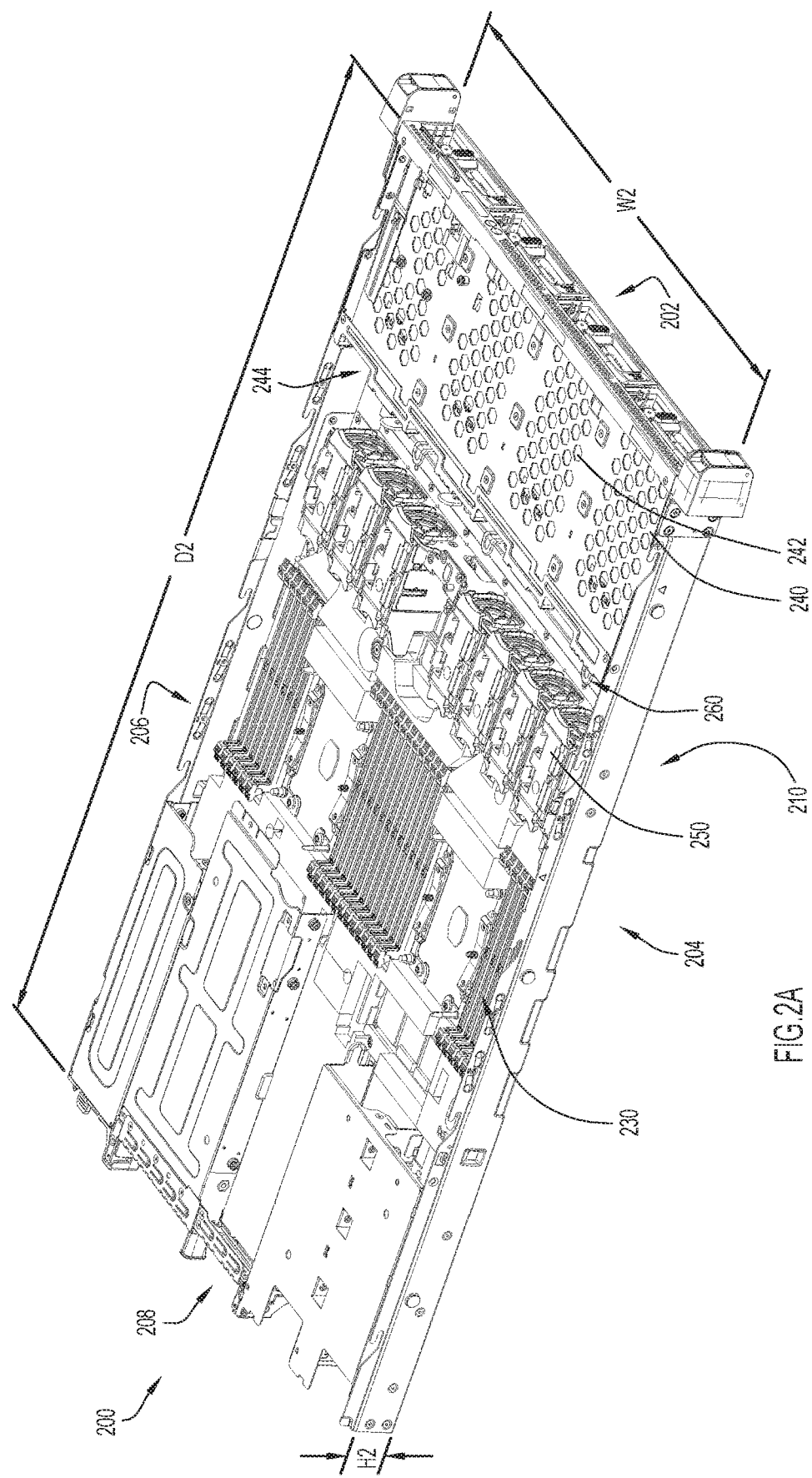
FIG. 2A illustrates a top perspective view of a 1U rackmount server with its top cover in an open position to expose a storage area, according to an example embodiment.
Figure 2B:
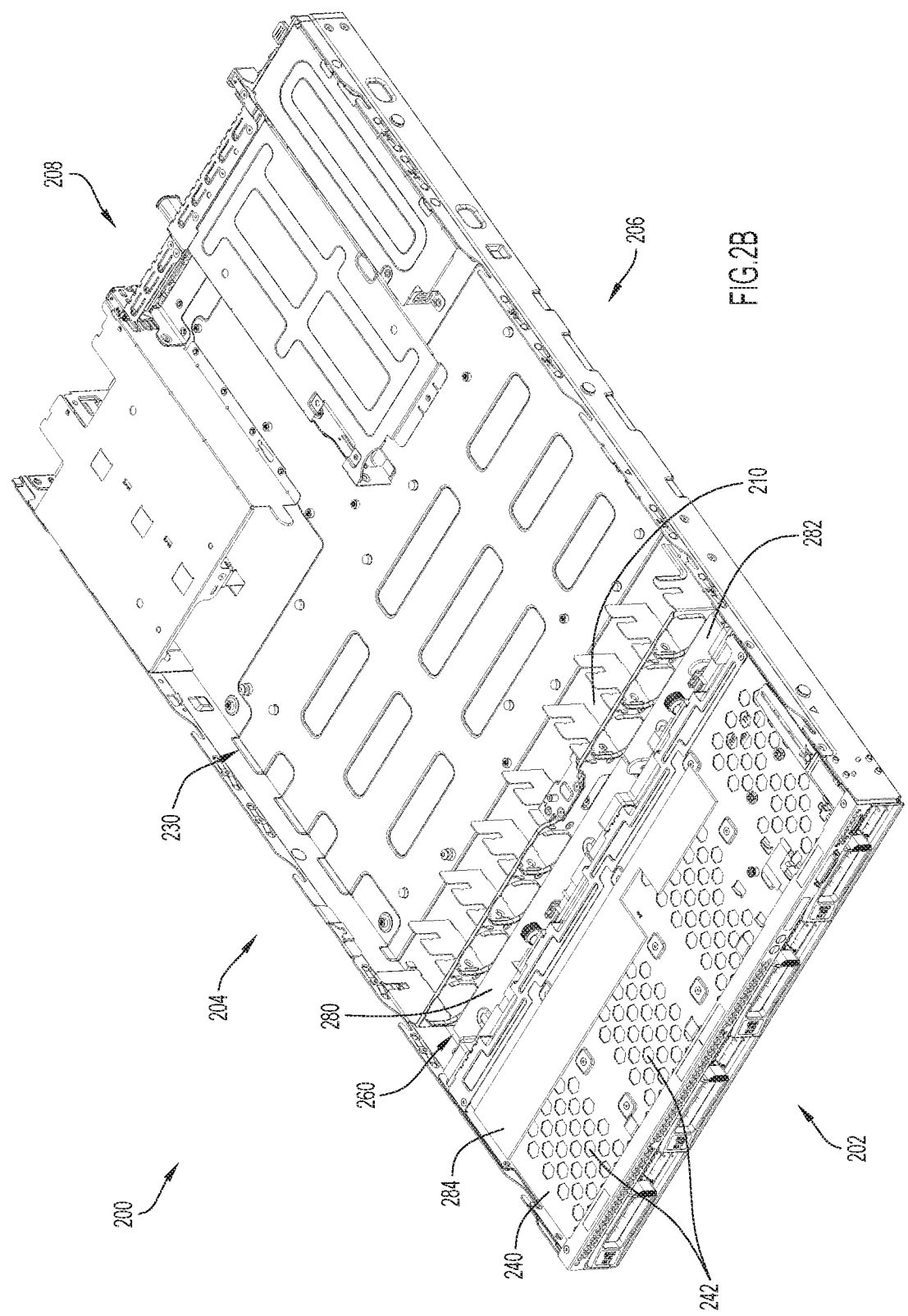
FIG. 2B illustrates a top perspective view of the 1U rackmount server of FIG. 2A with its top cover in an open position to expose a storage area, the 1U rackmount server being equipped with acoustic barriers according to an example embodiment.
Figure 2C:
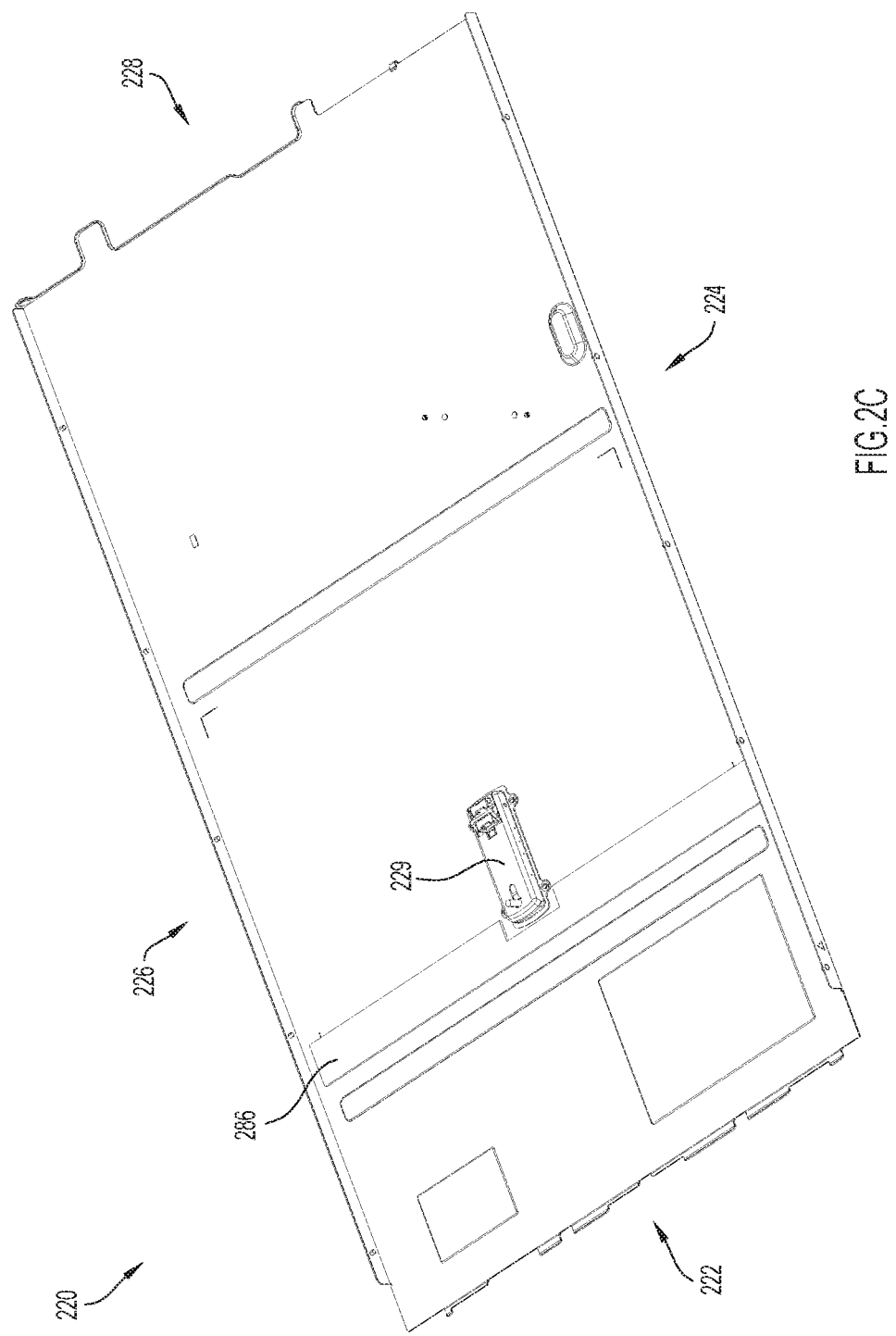
FIG. 2C illustrates a bottom perspective view of the top cover of the 1U rackmount server illustrated in FIG. 2A, the top cover being equipped with an acoustic barrier.

With reference to FIGS. 2A, 2B, and 2C illustrated is an example embodiment of a 1U rackmount server 200. The 1U rackmount server 200 includes a front side 202, a first (e.g., right) side 204, a second (e.g., left) side 206, a rear side 208, and a bottom side 210 that defines a storage area 230. In addition, the 1U rackmount server 200 may also include a top cover 220 (illustrated in FIG. 2C) that may be removably attached to sides 202, 204, 206, 208, 210 of the 1U rackmount server 200. The front side 202 and the rear side 208 of the 1U rackmount server 200 extend parallel to one another from the first side 204 to the second side 206, and substantially define the external width W2 of the 1U rackmount server 200 (insofar as substantially is meant to imply, for example, that the width W2 may be determined based on the length of the front 202 or the length of the front 202 plus the thicknesses of first side 204 and second side 206). Meanwhile, first and second sides 204, 206 extend parallel to one another and substantially vertically from the bottom side 210 such that the first and second sides 204, 206 may substantially define the external height H2 and external depth D2 of the 1U rackmount server 200.

In the depicted embodiment, the 1U rackmount server 200 is configured to fit in a full width 1U slot of a chassis/enclosure/server rack. That is, the 1U rackmount server 200 includes external dimensions configured to fit into a 1U slot of an enclosure/chassis/server rack and, thus, the external height H2 of the 1U rackmount server 200 may be approximately 1.75 inches (to satisfy the 1U rack unit slot requirement). Meanwhile, D2 and W2 may be sized to span the full depth and width, respectively, of the particular chassis/rack in which the 1U rackmount server 200 is mounted. For example, D2 may be approximately 13.9 inches, approximately 19.2 inches, or some other depth, and W2 may be approximately 19 inches, approximately 23 inches, or some other width. However, in other embodiments, the 1U rackmount server 200 may have a height H2, depth D2, and width W2 configured to span a 1U slot of any dimensions. For example, 1U rackmount server 200 may have a depth D2 and width W2 configured to span a half-width 1U slot.

As illustrated, the 1U rackmount server 200 includes a storage drive carrier 240 disposed within the storage area 230 proximate to the front side 202 of the 1U rackmount server 200, where the storage drive carrier 240 is configured to store and retain one or more storage drives 242 proximate to the front side 202 such that the storage drives 242 are disposed across the front side 202 and span substantially from the first side 204 to the second side 206. Moreover, like the schematic depiction of the rackmount server 100, the example embodiment of the 1U rackmount server 200 further includes a series of cooling fans 250 that are disposed within the storage area 230 such that the series of cooling fans span substantially from the first side 204 to the second side 206, and are spaced from the storage drives 242 by region or spacing 260.

FIG. 2A illustrates the 1U rackmount server 200 without being equipped with acoustic barriers. However, FIGS. 2B and 2C illustrate the example embodiment of the 1U rackmount server 200 and top cover 220 equipped with acoustic barriers 280, 282, 284, 286 in order to attenuate any acoustic pressures traveling from the series of fans 250, similar to that illustrated in FIGS. 1A and 1B. FIG. 2B illustrates the 1U rackmount server 200 without the series of fans 250 for illustrative purposes only. As illustrated in FIG. 2B, two acoustic barriers 280, 282 are disposed within the storage area 230 on the bottom surface 210 of the 1U rackmount server 200 such that the two acoustic barriers 280, 282 are disposed within the region or spacing 260 that is located between the backplane 244 of the storage drives 242 and the series of fans 250. FIG. 2B also illustrates that, in this example embodiment of the 1U rackmount server 200, a third acoustic barrier 284 is disposed atop the storage drive carrier 240 proximate to the backplane 244 of the storage drives 242 and the region 260.

Furthermore, as illustrated in FIG. 2C, the fourth acoustic barrier 286 is disposed on the inner surface of the top cover 220, which is illustrated as being removed from the 1U rackmount server 200 illustrated in FIG. 2B. The top cover 220 includes a front side 222, a first side 224, a second side 226, and a rear side 228, which aligns with the front side 202, first side 204, second side 206, and rear side 208, respectively, of the 1U rackmount server 200 when mounted on the 1U rackmount server 200. The top cover 220 further includes a latch mechanism 229, which is disposed more proximate to the front side 222 than the rear side 228 of the top cover 220, and is disposed equidistant from the first and second sides 224, 226. The latch mechanism 229 is configured to secure the top cover 220 to the 1U rackmount server 200. The fourth acoustic barrier 286 is disposed on the top cover 220 at a location that is proximate to the latch mechanism 229 and proximate to the front end 222 such that, when the top cover 220 is affixed to the 1U rackmount server 200, the fourth acoustic barrier 286 is disposed in the region 260 between the storage drives 242 and the series of fans 250.

Turning to FIGS. 3A and 3B, and with continued reference to FIGS. 1A, 1B, 2A, 2B, and 2C, illustrated are top views of the fan portion the storage area 230 of the 1U rackmount server 200 in which the series of fans 250 are disposed. The series of fans 250 are removed from the storage area 230 in FIGS. 3A and 3B for illustrative purposes only. As best illustrated in FIGS. 3A and 3B, the series of fans 250, when disposed in the storage area 230, are disposed within a series of fan slots or bays 252(1)-252(7). The example embodiment of the 1U rackmount server 200 includes a plate 300 disposed proximate to, and forward of, the fan bays 252(1)-252(7) such that the plate 300 may be disposed within the region 260. The plate 300 includes upstanding members 302, 304, 306 that may extend substantially vertically from the plate 300 in the region 260. As illustrated, the first upstanding member 302 is disposed proximate to the first side 204, the third upstanding member 306 is disposed proximate to the second side 206, and the second upstanding member 304 is disposed between the first and third upstanding members 302, 306.

As best illustrated in FIG. 3B, the first and second acoustic barriers 280, 282 are disposed atop the plate 300, where the first acoustic barrier 280 is disposed more proximate to the first side 204, while the second acoustic barrier 282 is disposed more proximate to the second side 206. The first acoustic barrier 280 includes a front edge 310, an opposite rear edge 312, a first edge 314 disposed proximate to the first side 204 of the 1U rackmount server 200, and an opposite second edge 316. Similarly, the second acoustic barrier 282 includes a front edge 320, an opposite rear edge 322, a first edge 324 disposed proximate to the second edge 316 of the first acoustic barrier 280, and an opposite second edge 326 disposed proximate to the second side 206 of the 1U rackmount server 200. As illustrated in FIG. 3B, the first acoustic barrier 280 includes a first cutout portion 330 that is configured to enable the first acoustic barrier 280 to be affixed to the plate 300 while accommodating the first upstanding member 302. The second acoustic barrier 282 includes a second cutout portion 340 and a third cutout portion 350 that are configured to enable the second acoustic barrier 282 to be affixed to the plate 300 while accommodating the second and third upstanding members 304, 306.

As illustrated in FIG. 3C, in one example embodiment, the first acoustic barrier 280 may have an overall length of X1 and an overall width of Y1. Moreover, the first cutout portion 330 may be disposed within the front edge 310 such that the first cutout portion 330 is disposed proximate to the first edge 314 and is spaced from the rear edge 312 by a distance Y2. The first cutout portion 330 may also have a length of X2, which is smaller than the overall length of X1. In one example embodiment, X1 may be equal to approximately 250 mm, Y2 may be approximately equal to 32 mm, and both X2 and Y2 may be approximately equal to 20 mm.

As illustrated in FIG. 3D, in one example embodiment, the second acoustic barrier 282 may have an overall length of X3 and an overall width of Y3. In one embodiment, width Y3 may be substantially equal to the width Y1 of the first acoustic barrier 280, while the length X3 may be less than the length X1 of the first acoustic barrier 280. In addition, the second cutout portion 340 may be disposed within the front edge 320 such that the second cutout portion 340 is disposed proximate to the first edge 324 and is spaced from the rear edge 322 by a distance Y4. The third cutout portion 350 may also be disposed within the front edge 320 such that the third cutout portion 350 is disposed between the first edge 324 and the second edge 326, but is disposed more proximate to the second edge 326 than the first edge 324. Like the second cutout portion 340, the third cutout portion 350 is spaced from the rear edge 322 by a distance Y4. The second cutout portion 340 may have a length of X4, while the third cutout portion has a length of X5, and is spaced from the second edge 324 by a distance X6. In one example embodiment, X3 may be equal to approximately 130 mm, Y3 may be approximately equal to 32 mm, and Y4 may be approximately equal to 20 mm. Moreover, in the example embodiment, X4 may be approximately equal to 22 mm, X5 may be approximately equal 25 mm, and X6 may be approximately equal to 15 mm.

Turning to FIGS. 4A and 4B, and with continued reference to FIGS. 1A, 1B, 2A, 2B, and 2C, illustrated are top views of the storage drive carrier 240 of the storage area 230 of the 1U rackmount server 200. As illustrated, the storage drive carrier 240 is disposed proximate to the front side 202 of the 1U rackmount server 200. As previously explained, the storage drive carrier 240 is configured to house and retain one or more storage drives 242 such that the backplane 244 of the one or more storage drives 242 is disposed proximate to the region 260. As best illustrated in FIG. 4B, the third acoustic barrier 284 is disposed atop the storage drive carrier 240 such that the third acoustic barrier 284 is disposed more proximate to the first side 204 of the 1U rackmount server 200 than the second side 206. Moreover, the third acoustic barrier 284 is disposed more proximate to the backplane 244 of the storage drives 242 than the front side 202 of the 1U rackmount server 200. The third acoustic barrier 284 includes a front edge 410, an opposite rear edge 412, a first edge 414 disposed proximate to the first side 204 of the 1U rackmount server 200, and an opposite second edge 416. The third acoustic barrier 284 includes a cutout portion 420 that is disposed between the first edge 414 and the second edge 416.

Figure 4C:
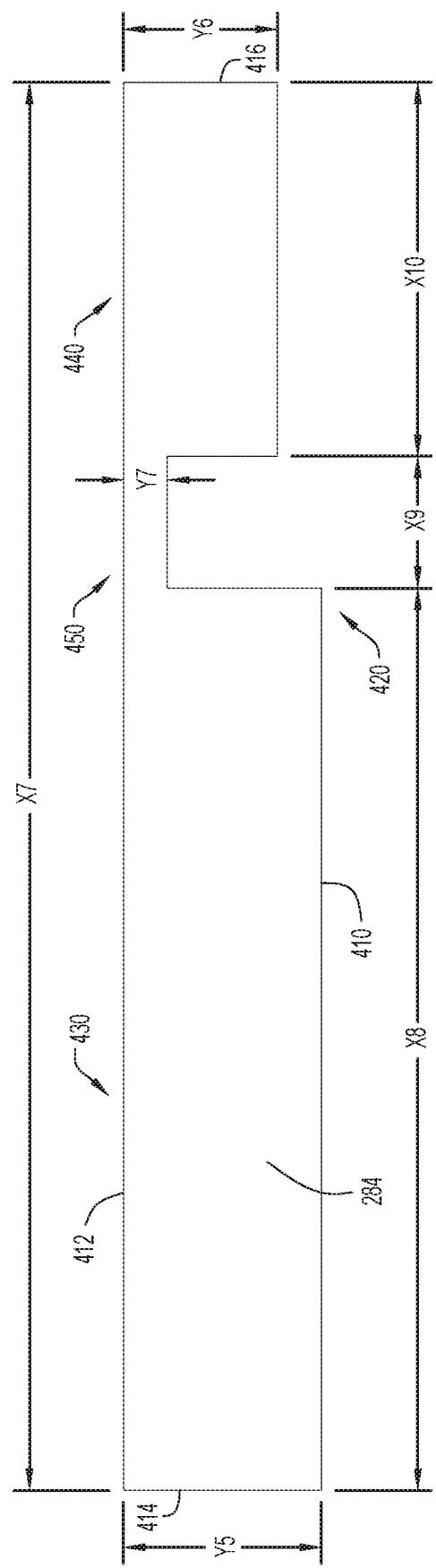
FIG. 4C illustrates a top view of the acoustic barrier illustrated in FIG. 4B.

As illustrated in FIG. 4C, in one example embodiment, the third acoustic barrier 284 may have an overall length of X7 and an overall width of Y5. The example embodiment of the third acoustic barrier 284 may include a first portion 430 and a second portion 440 that are separated from one another by the cutout portion 420 and connected to one another by bridge or connecting portion 450. The first portion 430 may have a width that is equal to the overall width Y5 of the third acoustic barrier 284, while the second portion 440 may have a width of Y6, which is less than the overall width Y5. The connecting portion 450 may have a width of Y7 that is less than both the overall width Y5 and the width Y6 of the second portion 440. As illustrated, the first portion 430 may have a length of X8, the cutout portion 420 have a length of X9, and the second portion 440 may have a length of X10. In one example embodiment, X7 may be equal to approximately 320 mm, Y5 may be approximately equal to 35 mm.

Furthermore, X8 may be approximately equal to 205 mm, X9 may be approximately equal to 30 mm, and X10 may be approximately equal to 85 mm. Y6 may be approximately equal to 35 mm, and Y7 may be approximately equal to 10 mm.

Turning to FIGS. 5A and 5B, and with continued reference to FIGS. 1A, 1B, 2A, 2B, and 2C, illustrated are bottom views of a portion of the top cover 220 of the 1U rackmount server 200. As illustrated, the top cover 220 includes a latch mechanism 229 that is disposed equidistant from the first side 224 and the second side 226 of the top cover 220. As best illustrated in FIG. 4B, the fourth acoustic barrier 286 is disposed on the inner surface of the top cover 220 proximate to the latch mechanism and such that the fourth acoustic barrier 286 extends from the first side 224 to the second side 226 of the top cover 220. The fourth acoustic barrier 286 includes a front edge 500, an opposite rear edge 502 disposed proximate to the latching mechanism 229, a first edge 504 disposed proximate to the first side 224 of the top cover 220, and an opposite second edge 506 disposed proximate to the second side 226 of the top cover 220. The fourth acoustic barrier 286 also includes a cutout portion 510 is disposed in the rear edge 502 and is equidistant from the first edge 504 and the second edge 506. The cutout portion 510 is configured to enable the fourth acoustic barrier 286 to be affixed to the top cover 220 while accommodating the latching mechanism 229.

Figure 5C:
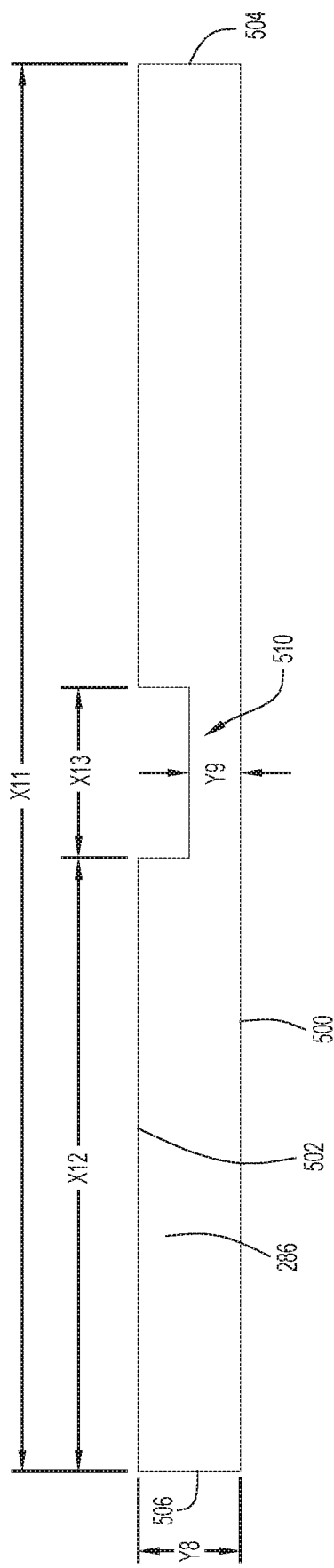
FIG. 5C illustrates a top view of the acoustic barrier illustrated in FIG. 5B.

As illustrated in FIG. 5C, in one example embodiment, the fourth acoustic barrier 286 may have an overall length of X11 and an overall width of Y8. The cutout portion 510 of the example embodiment of the third acoustic barrier 286 may be spaced from the first and second edges 504, 506 by a distance X12. Moreover, the cutout portion 510 may have a length X13 and may be disposed in the rear edge 502 such that the cutout portion 510 is spaced from the front edge 500 by a distance Y9. In one example embodiment, X11 may be approximately equal to 410 mm, and Y8 may be approximately equal to 30 mm. Furthermore, X12 may be approximately equal to 180 mm, X13 may be approximately equal to 50 mm, and Y9 may be approximately equal to 12 mm. Y6 may be approximately equal to 35 mm, and Y7 may be approximately equal to 10 mm.

The acoustic barriers 280, 282, 284, 286 may all have a thickness of approximately 2 mm. Each of the acoustic barriers may be constructed of a foam material, and more specifically, the CF-45EG CONFOR' EG Foam produced by Aearo Technologies, LLC. In other embodiments, the acoustic barriers 280, 282, 284, 286 may be of any other shapes and dimensions. Furthermore, any number of acoustic barriers may be equipped on the 1U rackmount server 100. The acoustic barriers 280, 282, 284, 286 may also be constructed from any other material that attenuates acoustic pressures or sound waves.

With reference to FIGS. 6A, 6B, 6C, and 6D, illustrated is an example embodiment of a 2U rackmount server 600. The example embodiment of the 2U rackmount server 600 includes a front side 602, a first side 604, an opposite second side 606, a rear side 608, and a bottom side 610 that define a storage area 630 of the 2U rackmount server 600. In addition, the 2U rackmount server 600 may include a top cover 620 (illustrated in FIG. 6D) that may be removably attached to the sides 602, 604, 606, 608, 610 of the 2U rackmount server 600. The front side 602 and the rear side 608 of the 2U rackmount server 600 extend parallel to one another from the first side 604 to the second side 606, and substantially define the external width W3 of the 2U rackmount server 600 (insofar as substantially is meant to imply, for example, that the width W3 may be determined based on the length of the front side 602 or the length of the front side 602 plus the thicknesses of first side 604 and second side 606). Meanwhile, first and second sides 604, 606 extend parallel to one another and substantially vertically from the bottom side 610 such that the first and second sides 604, 606 may substantially define the external height H3 and external depth D3 of the 2U rackmount server 600.

In the depicted embodiment, the 2U rackmount server 600 is configured to fit in a full width 2U slot of a chassis/enclosure/server rack. That is, the 2U rackmount server 600 includes external dimensions configured to fit into a 2U slot of an enclosure/chassis/server rack and, thus, the external height H3 of the 2U rackmount server 600 may be approximately 3.5 inches (to satisfy the 2U rack unit slot requirement). Meanwhile, D3 and W3 may be sized to span the full depth and width, respectively, of the particular chassis/rack in which the 2U rackmount server 600 is mounted. For example, D3 may be approximately 13.9 inches, approximately 19.2 inches, or some other depth, and W3 may be approximately 19 inches, approximately 23 inches, or some other width. However, in other embodiments, the 2U rackmount server 600 may have a height H3, depth D3, and width W3 configured to span a 2U slot of any dimensions. For example, 2U rackmount server 600 may have a depth D3 and width W3 configured to span a half-width 2U slot.

As illustrated, the example embodiment of the 2U rackmount server 600 includes a storage drive carrier 640 disposed within the storage area 630 proximate to the front side 602 of the 2U rackmount server 600, where the storage drive carrier 640 is configured to store and retain one or more storage drives 642 proximate to the front side 602 such that the storage drives 642 are disposed across the front side 602 and span substantially from the first side 604 to the second side 606. Moreover, like the schematic depiction of the rackmount server 100 and the 1U rackmount server 200, the example embodiment of the 2U rackmount server 600 further includes a series of cooling fans 650 that are disposed within the storage area 630 such that the series of cooling fans span substantially from the first side 604 to the second side 606, and are spaced from the storage drives 642 by region or spacing 660.

Figure 6A:
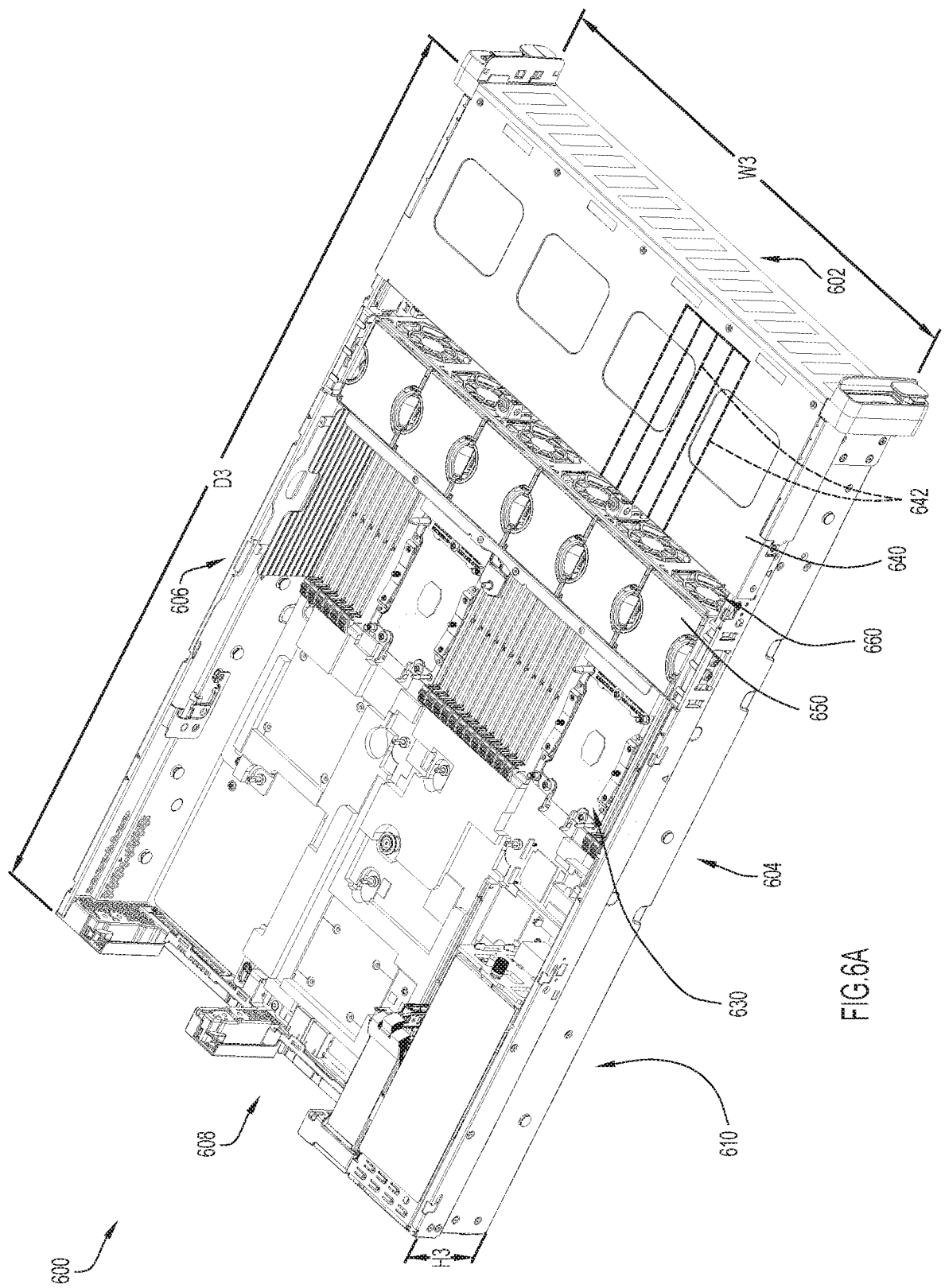
FIG. 6A illustrates a top perspective view of a 2U rackmount server with its top cover in an open position to expose a storage area, according to an example embodiment.
Figure 6B:
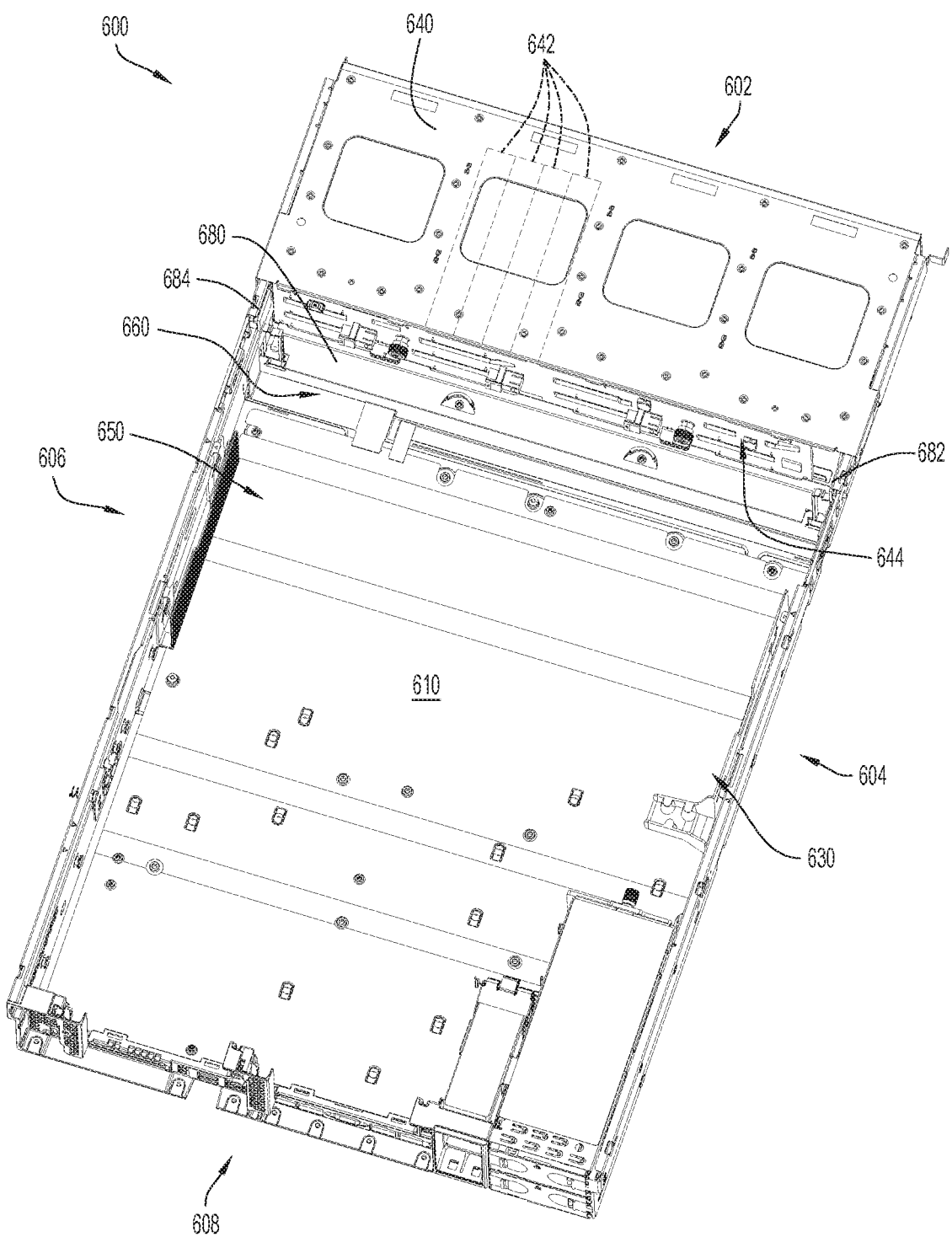
FIG. 6B illustrates a top perspective view of the 2U rackmount server of FIG. 6A with its top cover in an open position to expose a storage area, the 2U rackmount server being equipped with acoustic barriers.
Figure 6C:
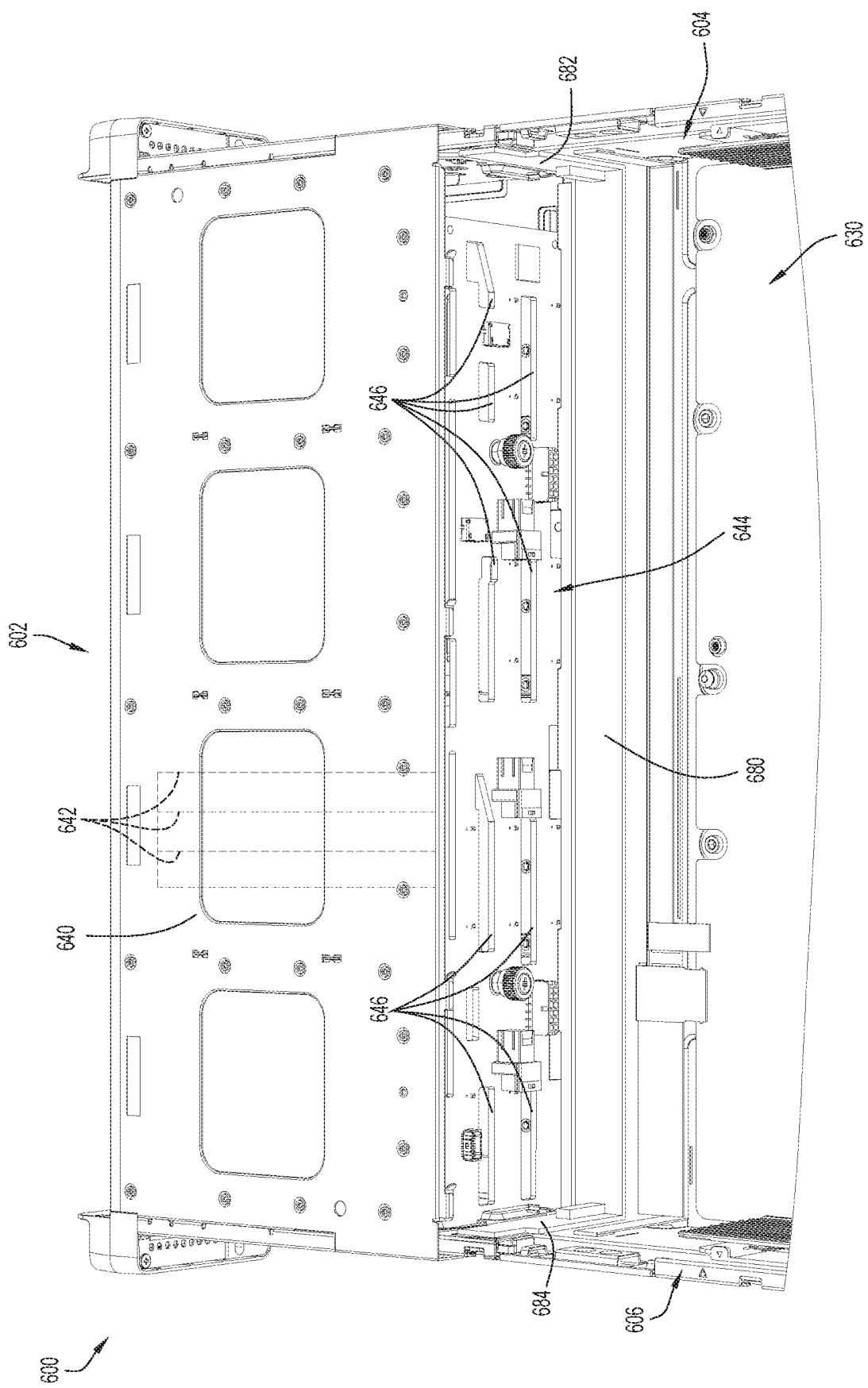
FIG. 6C illustrates a perspective view of the storage drive backplane of the 2U rackmount server illustrated in FIG. 6A.
Figure 6D:
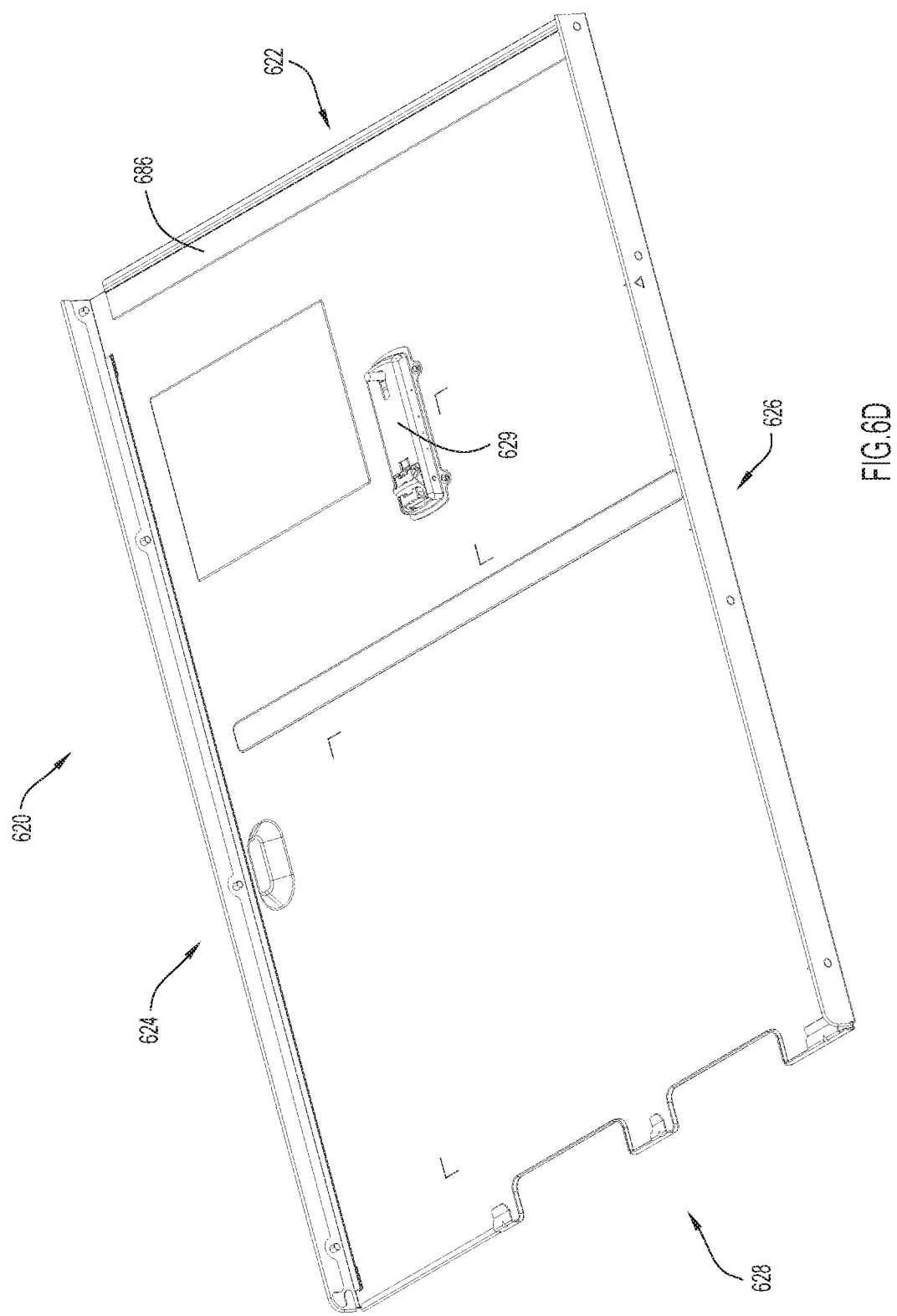
FIG. 6D illustrates a bottom perspective view of the top cover of the 2U rackmount server illustrated in FIG. 6A, the top cover being equipped with an acoustic barrier.

FIG. 6A illustrates the 2U rackmount server 600 without being equipped with acoustic barriers. However, FIGS. 6B, 6C, and 6D illustrate the example embodiment of the 2U rackmount server 600 and top cover 620 equipped with acoustic barriers 680, 682, 684, 686 in order to attenuate any sound waves traveling from the series of fans 650, similar to that illustrated in FIGS. 1A and 1B. FIG. 6B illustrates the 2U rackmount server 600 without many of the components disposed within the storage area 630, including the series of fans 650. Similarly, FIG. 6C illustrates a perspective view of the backplane 644 of the storage drive carrier 640 and the storage drives 642 of the 2U rackmount server 600 without the series of fans 650. The exclusion of the components, and especially the fans 650, are for illustrative purposes only. As illustrated in FIGS. 6B and 6C, three acoustic barriers 680, 682, 684 are disposed within the storage area 630 of the 2U rackmount server 600 such that the three acoustic barriers 680, 682 and 684 are disposed within the region or spacing 660 that is located between the backplane 644 of the storage drives 642 and the series of fans 650. The backplane 644 may contain a series of openings or slots 646 that permit the flow of air through the storage drive carrier 640 and around the storage drives 642 disposed within the storage drive carrier 640 in order to cool the storage drives 642. As previously explained, the series of cooling fans 650 are configured to draw air into the storage area 630 from the front side 602 of the 2U rackmount server 600. The series of openings 646 permit the flow of air into the storage area 630 through the front side 602 without impeding the flow of air.

Furthermore, as illustrated in FIG. 6D, the fourth acoustic barrier 686 is disposed on the inner surface of the top cover 620, which is illustrated as being removed from the 2U rackmount server 600 illustrated in FIGS. 6B and 6C. The top cover 620 includes a front side 622, a first side 624, a second side 626, and a rear side 628, which align with the front side 602, first side 604, second side 606, and rear side 608, respectively, of the 2U rackmount server 600 when mounted on the 2U rackmount server 600. The top cover 620 further includes a latch mechanism 629, which is disposed more proximate to the front side 622 than the rear side 628 of the top cover 620, and is configured to secure the top cover 620 to the 2U rackmount server 600. The latch mechanism 629 is also disposed equidistant from the first side 624 and the second side 626. The fourth acoustic barrier 686 is disposed on the inner surface of the top cover 620 at a location that is proximate to the front end 622 of the top cover 620.

Turning to FIGS. 7A, 7B, and 7C, and with continued reference to FIGS. 1A, 1B, 6A, 6B, 6C, and 6D, illustrated are top views of the region 660 of the storage area 630 of the 2U rackmount server 600. The series of fans 650 are removed from the storage area 630 in FIGS. 6A and 6B for illustrative purposes only. As best illustrated in FIGS. 7A, 7B, and 7C, the bottom surface 610 of the 2U rackmount server 600 is exposed in the region 660 of the storage area 630. The bottom surface 610 includes two sets of openings 700, 702 that are spaced from one another and spaced from the first and second sides 604, 606 such that the first opening 700 is disposed closer to the first side 604 than the second opening 702. In addition, a first upstanding extension member 710 extends into the region 660 from the first side 604, while a second upstanding extension member 712 extends into the region 660 from the second side 606. The first and second upstanding extension members 710, 712 may extend substantially vertically from the bottom surface 610 of the 2U rackmount server 600.

As best illustrated in FIG. 7D, the first acoustic barrier 680 is disposed atop the exposed portion of the bottom surface 610 in the region 660 such that the first acoustic barrier 680 extends from the first side 604 to the second side 606 of the 2U rackmount server 600. The first acoustic barrier includes a front edge 720, an opposite rear edge 722, a first edge 724 disposed proximate to the first side 604 of the 2U rackmount server 600, and an opposite second edge 726 disposed proximate to the second side 606 of the 2U rackmount server 600. As illustrated in FIG. 7D, the first acoustic barrier 680 includes a series of cutout portions 730, 732, 734, 736 that are configured to enable the first acoustic barrier 680 to be affixed to the bottom surface 610 while accommodating the first and second openings 700, 702 and the first and second upstanding extension members 710, 712.

As illustrated in FIG. 7E, the second acoustic barrier 682 is disposed along the inner surface of the first side 604 of the 2U rackmount server 600. The second acoustic barrier includes a front edge 740, an opposite rear edge 742, an upper edge 744, and an opposite lower edge 746 disposed proximate to the bottom side 610 of the 2U rackmount server 600. As illustrated in FIG. 7E, the second acoustic barrier 682 includes a cutout portion 750 that is configured to enable the second acoustic barrier 682 to be affixed to the first side 604 while accommodating the first upstanding extension member 710. Similarly, as illustrated in FIG. 7F, the third acoustic barrier 684 is disposed along the inner surface of the second side 606 of the 2U rackmount server 600. The third acoustic barrier includes a front edge 760, an opposite rear edge 762, an upper edge 764, and an opposite lower edge 766 disposed proximate to the bottom side 610 of the 2U rackmount server 600. As illustrated in FIG. 7F, the third acoustic barrier 684 includes a cutout portion 770 that is configured to enable the third acoustic barrier 684 to be affixed to the second side 606 while accommodating the second upstanding extension member 712. The second and third acoustic barriers 682, 684 may be mirror images of one another.

Turning to FIG. 7G, illustrated is one example embodiment of the first acoustic barrier 680. In the example embodiment, the first acoustic barrier 680 may have an overall length of M1 and an overall width of N1. The first cutout portion 730 may be disposed within the rear edge 722 proximate to the first edge 724 such that the first cutout portion 730 has a length of M2 and is spaced from the front edge 720 by a distance of N2. The second and third cutout portions 732, 734, while illustrated as half circles, may have any other shape. The second cutout portion 732 may be spaced from the first edge 724 by a distance M4, while the third cutout portion 734 may be spaced from the second cutout portion 732 by a distance M5. Both the second and third cutout portions 732, 734 may be spaced from the rear edge 722 by a distance N3, and may both have a diameter of Ø1. In addition, the fourth cutout portion 736 may be disposed within the rear edge 722 proximate to the second edge 726 such that the fourth cutout portion 736 has a length of M3 and is spaced from the front edge 720 by a distance of N2. In one example embodiment, M1 may be equal to approximately 415 mm, M2 may be approximately equal to 17 mm, M3 may be approximately equal to 14 mm, M4 may be approximately equal to 139.4 mm, and M5 may be approximately equal to 135.6 mm. Furthermore, N1 may be approximately equal to 27 mm, N2 may be approximately equal to 16.5 mm, and N3 may be approximately equal to 6.9 mm. The diameter Ø1 of the second and third cutout portions 732, 734 may be approximately equal to 24.6 mm.

As illustrated in FIG. 7H, in one example embodiment, the second acoustic barrier 682 may have an overall width of M6 and an overall height of N4. In the example embodiment, the cutout portion 750 may be disposed in the rear edge 742 of the second acoustic barrier 682 proximate to the bottom edge 746 of the second acoustic barrier 682. The cutout portion 750 may have a height of N5 and may be spaced from the front edge 740 by a distance of M7. In one example embodiment, M6 may be equal to approximately 25 mm and M7 may be approximately equal to 16.57 mm. In addition, N4 may be approximately equal to 75.3 mm, and N5 may be approximately equal to 55.3 mm.

With reference to FIG. 7I, in one example embodiment, the third acoustic barrier 684 may have an overall width of M8 and an overall height of N6. In the example embodiment, the cutout portion 770 may be disposed in the rear edge 762 of the third acoustic barrier 684 proximate to the bottom edge 766 of the third acoustic barrier 684. The cutout portion 770 may have a height of N7 and may be spaced from the front edge 760 by a distance of M9. In one example embodiment, M8 may be equal to approximately 25 mm and M9 may be approximately equal to 16.57 mm. In addition, N6 may be approximately equal to 75.3 mm, and N7 may be approximately equal to 55.3 mm.

Turning to FIGS. 8A and 8B, and with continued reference to FIGS. 1A, 1B, 6A, 6B, 6C, and 6D, illustrated are bottom views of a portion of the top cover 620 of the 2U rackmount server 600. As illustrated, the top cover 620 includes a latch mechanism 629 that is disposed equidistant from the first side 624 and the second side 626 of the top cover 620. As best illustrated in FIG. 8B, the fourth acoustic barrier 686 is disposed on the inner surface of the top cover 620 proximate to front side 622, and spaced from the latch mechanism 629, such that the fourth acoustic barrier 686 extends from the first side 624 to the second side 626 of the top cover 620. The fourth acoustic barrier 686 includes a front edge 800, an opposite rear edge 802 disposed more proximate to the latching mechanism 629 than the front edge 800, a first edge 804 disposed proximate to the first side 624 of the top cover 620, and an opposite second edge 806 disposed proximate to the second side 626 of the top cover 620. In the example embodiment illustrated, the fourth acoustic barrier 686 does not contain a cutout portion.

Figure 8C:
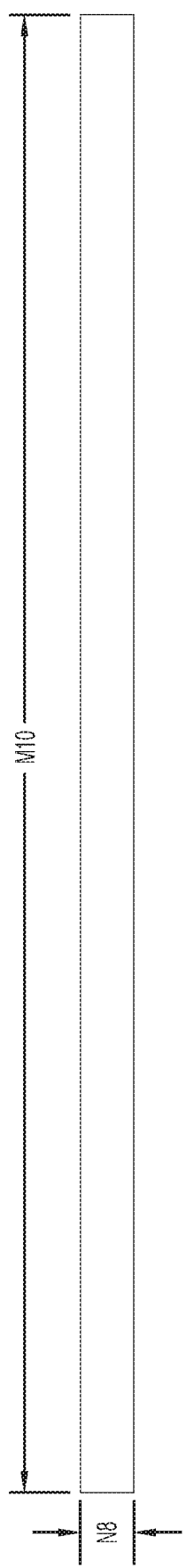
FIG. 8C illustrates a top view of the acoustic barrier illustrated in FIG. 8B.

As illustrated in FIG. 8C, in one example embodiment, the fourth acoustic barrier 686 may have an overall length of M10 and an overall width of N8. M10 may be equal to approximately 413 mm, and N8 may be approximately equal to 15 mm.

Turning to FIG. 9, and with continued reference to FIGS. 1A, 1B, 6A, 6B, 6C, and 6D, illustrated is an additional embodiment of the acoustic barriers that may be disposed within the 2U rackmount server 600. While FIG. 9 illustrates the three acoustic barriers 680, 682, 684 that are disposed within the region 660 of the storage area 630, as illustrated in FIGS. 6B and 6C, FIG. 9 also illustrates an additional upstanding acoustic barrier 900 that is disposed within the region 660 and spans substantially from the first side 604 to the second side 606 of the 2U rackmount server 600. The upstanding acoustic barrier 900 may be disposed against the backplane 644 of the storage drives 642 such that the upstanding acoustic barrier 900 extends substantially upward or vertically from the first acoustic barrier 680. Because the upstanding acoustic barrier 900 is disposed against the backplane 644, the upstanding acoustic barrier 900 includes a series of apertures 910 that are configured to align with the series of openings 646 in the backplane 644. In the illustrated embodiment, the series of apertures 910 are nearly identical in shape, size, and orientation to the series of openings 646 of the backplane 644. These apertures 910 enable the upstanding acoustic barrier 900 to provide additional attenuation to the acoustic pressures created by the series of fans 650 while still promoting the flow of air through the storage area 630 to cool the storage drives 642.

The acoustic barriers 680, 682, 684, 686, 900 may all have a thickness of approximately 4 mm. Each of the acoustic barriers 680, 682, 684, 686, 900 may be constructed of a foam material, and more specifically, the CF-45EG CONFOR™ EG foam produced by Aearo Technologies, LLC. In other embodiments, the acoustic barriers 680, 682, 684, 686, 900 may be of any other shapes and dimensions. Furthermore, any number of acoustic barriers may be equipped on the 2U rackmount server 200. The acoustic barriers 680, 682, 684, 686, 900 may also be constructed from any other material that attenuates acoustic pressures or sound waves.

There are several advantages to the strategic positioning of acoustic barriers/members as presented herein. Storage drive throughput may still be degraded through acoustic pressures produced by the fans of a rackmount server, even when the fans and the storage drives are mounted to isolate and/or dampen mechanical vibrations. Since the fans in more powerful electrical devices are configured to run at higher speeds than previous generations of servers or electrical devices, the acoustic pressures from the fans are having a greater effect on the performance of the storage drives. The placement of acoustic barriers between the fans and the storage drives attenuates the amplitude of the acoustic pressures. By strategically placing the acoustic barriers along the bottom side, first and second sides, and the top cover in the region that separates the fans from the storage drives, the acoustic pressures that reach the storage drives a minimized or attenuated. In addition, the strategic placement of the acoustic barriers does not impede the flow of air through the housing, which is used to cool the storage drives to prevent them from overheating.

The acoustic barriers may also be shaped to be identical to that of the backplane of the storage drives. In other words, the acoustic barriers include a series of openings, slots, or apertures that are aligned with the openings of the backplane of the storage drives in order to prevent these acoustic barriers from impeding the flow of cooling air through the housing. These acoustic barriers may provide additional attenuation to the acoustic pressures generated by the fans since these acoustic barriers are disposed within a more direct path between the storage drives and the fans.

To summarize, in one form, an apparatus is provided that comprises: a housing including a bottom side that is bounded by a front side, a back side, a first side extending from the front side to the back side, and a second side opposite the first side; one or more storage drives disposed within the housing; and one or more acoustic barriers disposed within the housing proximate to the one or more storage drives, the one or more acoustic barriers providing attenuation of sound waves traveling toward the one or more storage drives while simultaneously promoting a flow of cooling air around the one or more storage drives.

In another form, an apparatus comprises: a housing including a bottom side that is bounded by a front side, a back side, a first side extending from the front side to the back side, and a second side opposite the first side; one or more storage drives disposed within the housing; one or more fans disposed within the housing, the one or more fans being spaced from the one or more storage drives; and one or more acoustic barriers disposed within the housing between the one or more storage drives and the one or more fans.

In still another form, an apparatus comprises: a housing including a bottom that is bounded by a front side, a back side, a first side extending from the front side to the back side, and a second side opposite the first side; one or more fans disposed within the housing and configured to generate a flow of air through the housing to cool components disposed within the housing; and one or more acoustic barriers disposed within the housing proximate to the one or more fans, the one or more acoustic barriers providing attenuation of sound waves created by the one or more fans when generating the flow of air while simultaneously enabling the flow of air to travel through the housing.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims. For example, as mentioned, the concepts described herein may be utilized for rackmount servers that that fit into chassis/enclosure/server rack slots other than 1U and 2U slots. The concepts described herein may also be utilized in server types other than rackmount servers.

What is claimed is:

1. An apparatus comprising:
a housing including a bottom side that is bounded by a front side, a back side, a first side extending from the front side to the back side, and a second side opposite the first side;
one or more storage drives disposed within the housing, wherein the one or more storage drives form a backplane within the housing; and
one or more acoustic barriers disposed within the housing proximate to the one or more storage drives, the one or more acoustic barriers providing attenuation of sound waves traveling toward the one or more storage drives while simultaneously promoting a flow of cooling air around the one or more storage drives, wherein the one or more acoustic barriers include a single structure upstanding acoustic barrier that is planar with series of apertures that permit the flow of cooling air and disposed directly against the backplane and constructed from a material that attenuates acoustic pressures.

2. The apparatus of claim 1, wherein each of the one or more acoustic barriers is constructed from acoustic foam.

3. The apparatus of claim 1, wherein the housing is sized to be received in a 1U slot of a server rack.

4. The apparatus of claim 1, wherein the housing is sized to be received in a 2U slot of a server rack.

5. The apparatus of claim 1, wherein the one or more acoustic barriers are disposed along an inner surface of the bottom side, an inner surface of the first side, and an inner surface of the second side.

6. The apparatus of claim 1, further comprising:
a removable top cover removably attached to the housing.

7. The apparatus of claim 6, wherein an upper acoustic barrier is disposed on an inner surface of the removable top cover at a location that positions the upper acoustic barrier proximate to the one or more storage drives when the removable top cover is coupled to the housing.

8. The apparatus of claim 1, wherein the backplane of the one or more storage drives includes a series of openings that permit the flow of cooling air.

9. The apparatus of claim 8, wherein the single structure upstanding acoustic barrier includes the series of apertures that align with the series of openings of the backplane.

10. An apparatus comprising:
a housing including a bottom side that is bounded by a front side, a back side, a first side extending from the front side to the back side, and a second side opposite the first side;
one or more storage drives disposed within the housing, wherein the one or more storage drives form a backplane within the housing that includes a series of openings;
one or more fans disposed within the housing, the one or more fans being spaced from the one or more storage drives; and
one or more acoustic barriers disposed within the housing between the one or more storage drives and the one or more fans, wherein the one or more acoustic barriers include a single structure upstanding acoustic barrier that is planar with series of apertures that permits a flow of cooling air and disposed directly against the backplane and constructed from a material that attenuates acoustic pressures.

11. The apparatus of claim 10, wherein the acoustic barriers are configured to attenuate sound waves generated by the one or more fans as the sound waves travel toward the one or more storage drives.

12. The apparatus of claim 10, further comprising:
a removable top cover removably attached to the housing.

13. The apparatus of claim 12, wherein the one or more acoustic barriers include an upper acoustic barrier disposed on an inner surface of the removable top cover at a location that positions the upper acoustic barrier between the one or more fans and the one or more storage drives when the removable top cover is attached to the housing.

14. The apparatus of claim 10, wherein the one or more acoustic barriers is disposed along the bottom side, the first side, and the second side.

15. The apparatus of claim 10, wherein the one or more acoustic barriers is constructed from acoustic foam.

16. An apparatus comprising:
a housing including a bottom that is bounded by a front side, a back side, a first side extending from the front side to the back side, and a second side opposite the first side;
one or more fans disposed within the housing and configured to generate a flow of air through the housing to cool components disposed within the housing; and
one or more acoustic barriers disposed within the housing proximate to the one or more fans, the one or more acoustic barriers providing attenuation of sound waves created by the one or more fans when generating the flow of air while simultaneously enabling the flow of air to travel through the housing, wherein the one or more acoustic barriers include a single structure upstanding acoustic barrier that is planar with series of apertures that permits the flow of air and disposed directly against to a backplane of one or more storage drives disposed within the housing, the single structure upstanding acoustic barrier being constructed from a material that attenuates acoustic pressures.

17. The apparatus of claim 16, wherein the one or more fans are spaced from the front side and the back side, and are oriented laterally within the housing such that the one or more fans span from the first side to the second side.

18. The apparatus of claim 16, further comprising:
a removable top cover removably attached to the housing.

19. The apparatus of claim 18, wherein the one or more acoustic barriers includes an upper acoustic barrier disposed on an inner surface of the removable top cover at a location that positions the upper acoustic barrier proximate to the one or more fans when the removable top cover is attached to the housing.

20. The apparatus of claim 16, wherein the one or more acoustic barriers is constructed from acoustic foam.

* * * * *